United States Patent
Tan et al.

(10) Patent No.: US 12,165,872 B2
(45) Date of Patent: Dec. 10, 2024

(54) METHODS AND SYSTEMS FOR ADVANCED ION CONTROL FOR ETCHING PROCESSES

(71) Applicant: Lam Research Corporation, Fremont, CA (US)

(72) Inventors: Zhongkui Tan, Fremont, CA (US); Qian Fu, Pleasanton, CA (US); Ying Wu, Livermore, CA (US); Qing Xu, Fremont, CA (US); John Drewery, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 947 days.

(21) Appl. No.: 17/196,778

(22) Filed: Mar. 9, 2021

(65) Prior Publication Data

US 2021/0193474 A1 Jun. 24, 2021

Related U.S. Application Data

(60) Division of application No. 15/819,696, filed on Nov. 21, 2017, now Pat. No. 10,943,789, which is a
(Continued)

(51) Int. Cl.
*H01J 37/32* (2006.01)
*H01L 21/3065* (2006.01)
(Continued)

(52) U.S. Cl.
CPC .... *H01L 21/3065* (2013.01); *H01J 37/32082* (2013.01); *H01J 37/32146* (2013.01);
(Continued)

(58) Field of Classification Search
CPC ........ C23C 16/45561; C23C 16/45544; C23C 16/45525; C23C 16/507; C23C 16/509;
(Continued)

(56) References Cited

U.S. PATENT DOCUMENTS

| | | | | |
|---|---|---|---|---|
| 6,806,652 B1 * | 10/2004 | Chistyakov | ............. | H01J 37/34 |
| | | | | 315/111.41 |
| 9,824,896 B2 * | 11/2017 | Tan | ........................ | H01L 21/308 |
| 10,943,789 B2 * | 3/2021 | Tan | ................... | H01L 21/32136 |
| 2001/0051438 A1 | 12/2001 | Shin et al. | | |

(Continued)

OTHER PUBLICATIONS

S. Wolf and R. N. Tauber, (Silicon Processing for the VLSI Era, vol. I—Process Technology, Lattice Press, 1986) (pp. 331-353).

*Primary Examiner* — Rudy Zervigon
(74) *Attorney, Agent, or Firm* — Penilla IP, APC

(57) ABSTRACT

A substrate is disposed on a substrate holder within a process module. The substrate includes a mask material overlying a target material with at least one portion of the target material exposed through an opening in the mask material. A plasma is generated in exposure to the substrate. For a first duration, a bias voltage is applied at the substrate holder at a first bias voltage setting corresponding to a high bias voltage level. For a second duration, after completion of the first duration, a bias voltage is applied at the substrate holder at a second bias voltage setting corresponding to a low bias voltage level. The second bias voltage setting is greater than 0 V. The first and second durations are repeated in an alternating and successive manner for an overall period of time necessary to remove a required amount of the target material exposed on the substrate.

20 Claims, 14 Drawing Sheets

Related U.S. Application Data continuation of application No. 14/932,458, filed on Nov. 4, 2015, now Pat. No. 9,824,896.

(51) Int. Cl.

| | | |
|---|---|---|
| *H01L 21/308* | (2006.01) | |
| *H01L 21/311* | (2006.01) | |
| *H01L 21/3213* | (2006.01) | |
| *H01L 21/67* | (2006.01) | |

(52) U.S. Cl.
CPC .. *H01J 37/32165* (2013.01); *H01J 37/32174* (2013.01); *H01J 37/3244* (2013.01); *H01J 37/32715* (2013.01); *H01L 21/30655* (2013.01); *H01L 21/308* (2013.01); *H01L 21/31116* (2013.01); *H01L 21/31122* (2013.01); *H01L 21/31138* (2013.01); *H01L 21/31144* (2013.01); *H01L 21/32136* (2013.01); *H01L 21/67069* (2013.01); *H01J 2237/334* (2013.01); *Y02P 80/30* (2015.11)

(58) Field of Classification Search
CPC ........... C23C 16/5096; C23C 16/45565; H01J 37/3244; H01J 2237/332; H01J 15/00; H01J 37/32091; H01J 37/32082; H01J 37/32623; H01J 37/32009; H01J 37/32532; H01J 37/32018; H01J 37/32027; H01J 37/32036; H01J 37/321; H01J 37/3211; H01J 37/32119; H01L 21/02; H01L 21/67; H01L 21/67017; H01L 21/67098; H01L 21/0228; H01L 21/67069

USPC ...... 118/723 E, 723 ER, 663, 665, 668, 688, 118/696; 156/345.43, 345.44, 345.45, 156/345.46, 345.47, 345.24, 345.25, 156/345.26, 345.27, 345.28

See application file for complete search history.

(56) References Cited

U.S. PATENT DOCUMENTS

| | | | |
|---|---|---|---|
| 2004/0000875 | A1 | 1/2004 | Vahedi et al. |
| 2005/0241762 | A1* | 11/2005 | Paterson ........... H01J 37/32165 156/345.28 |
| 2007/0080140 | A1 | 4/2007 | Hoffman et al. |
| 2007/0227668 | A1 | 10/2007 | Iizuka et al. |
| 2007/0246163 | A1 | 10/2007 | Paterson et al. |
| 2008/0061029 | A1 | 3/2008 | Lai et al. |
| 2008/0236490 | A1 | 10/2008 | Paterson et al. |
| 2008/0251207 | A1 | 10/2008 | Chen et al. |
| 2009/0032191 | A1* | 2/2009 | Chistyakov ....... H01J 37/32623 156/345.44 |
| 2009/0078678 | A1 | 3/2009 | Kojima et al. |
| 2009/0142859 | A1 | 6/2009 | Liu et al. |
| 2010/0041235 | A1 | 2/2010 | Hashimoto et al. |
| 2010/0227420 | A1 | 9/2010 | Banna et al. |
| 2012/0214313 | A1 | 8/2012 | Ooya et al. |
| 2013/0023064 | A1 | 1/2013 | Marakhtanov et al. |
| 2013/0105443 | A1* | 5/2013 | Banna ............... H01J 37/32165 216/67 |
| 2015/0011088 | A1* | 1/2015 | McNie ............... H01J 37/32816 216/60 |
| 2015/0072530 | A1 | 3/2015 | Kim et al. |
| 2015/0371851 | A1 | 12/2015 | Lee et al. |
| 2016/0013067 | A1 | 1/2016 | Wang et al. |
| 2016/0087075 | A1 | 3/2016 | Zhang et al. |
| 2016/0126069 | A1 | 5/2016 | Kwon et al. |
| 2018/0053633 | A1 | 2/2018 | Glazek et al. |

* cited by examiner

METHODS AND SYSTEMS FOR ADVANCED ION CONTROL FOR ETCHING PROCESSES

CLAIM OF PRIORITY

This application is a divisional application under 35 U.S.C. 121 of U.S. patent application Ser. No. 15/819,696, filed on Nov. 21, 2017, issued as U.S. Pat. No. 10,943,789, on Mar. 9, 2021, which is a continuation application under 35 U.S.C. 120 of U.S. patent application Ser. No. 14/932,458, filed on Nov. 4, 2015, issued as U.S. Pat. No. 9,824,896, on Nov. 21, 2017. The disclosure of each above-identified patent application is incorporated herein by reference in its entirety for all purposes.

BACKGROUND

1. Field of the Invention

The present invention relates to semiconductor device fabrication.

2. Description of the Related Art

Many modern semiconductor chip fabrication processes include generation of a plasma from which ions and/or radical constituents are derived for use in either directly or indirectly affecting a change on a surface of a substrate exposed to the plasma. For example, various plasma-based processes can be used to etch material from a substrate surface, deposit material onto a substrate surface, or modify a material already present on a substrate surface. The plasma is often generated by applying radiofrequency (RF) power to a process gas in a controlled environment, such that the process gas becomes energized and transforms into the desired plasma. The characteristics of the plasma are affected by many process parameters including, but not limited to, material composition of the process gas, flow rate of the process gas, geometric features of the plasma generation region and surrounding structures, temperatures of the process gas and surrounding materials, frequency and magnitude of the RF power applied, and bias voltage applied to attract charged constituents of the plasma toward the substrate, among others. It is of interest to understand and control some of the process parameters that may affect how the generated plasma interacts with the substrate, particularly with regard to generation and application of the bias voltage. It is within this context that the present invention arises.

SUMMARY

In an example embodiment, a method is disclosed for plasma etching of a target material in semiconductor device fabrication. The method includes an operation (a) for disposing a substrate on a substrate holder within a process module. The substrate includes a mask material overlying a target material with at least one portion of the target material exposed through an opening in the mask material. The method includes an operation (b) for generating a plasma in exposure to the substrate. The method includes an operation (c) for applying a bias voltage at the substrate holder at a first bias voltage setting corresponding to a high bias voltage level, for a first duration. The method includes an operation (d) for applying a bias voltage at the substrate holder at a second bias voltage setting corresponding to a low bias voltage level, for second duration, after completion of the first duration. The second bias voltage setting is greater than 0 V. And, the second bias voltage setting is sufficiently low to avoid ion-induced removal of the mask material. The method includes and operation (e) for repeating operations (c) and (d) in an alternating and successive manner for an overall period of time necessary to remove a required amount of the target material exposed on the substrate.

In an example embodiment, a system is disclosed for plasma etching of a target material in semiconductor device fabrication. The system includes a substrate holder configured to support a substrate in exposure to a plasma. The system includes an RF power supply connected to generate and transmit RF signals to the substrate holder for generating a bias voltage at the substrate holder. The RF power supply includes a first RF generator, a second RF generator, RF synchronization logic, and impedance matching circuitry. The first RF generator and the second RF generator are configured to operate independently of each other. The RF synchronization logic is configured to synchronize operation of the first RF generator and the second RF generator to enable generation of the bias voltage at the substrate holder as required for each of two alternating process states.

In an example embodiment, a method is disclosed for plasma etching of a target material in semiconductor device fabrication. The method includes an operation (a) for disposing a substrate on a substrate holder within a process module. The substrate includes a mask material overlying a target material with at least one portion of the target material exposed through an opening in the mask material. The method includes an operation (b) for generating a plasma in exposure to the substrate. The method includes an operation (c) for applying a bias voltage at the substrate holder at a first bias voltage setting corresponding to a high bias voltage level, for a first duration. The method includes an operation (d) for applying a bias voltage at the substrate holder at a second bias voltage setting corresponding to a low bias voltage level, for second duration, after completion of the first duration. The second bias voltage setting is greater than 0 V. And, the second bias voltage setting is sufficiently low to avoid ion-induced removal of the mask material. The method also includes an operation (e) in which, for a third duration after completion of the second duration, zero bias voltage is applied at the substrate holder. The method also includes and operation (f) for repeating operations (c), (d), and (e) in a successive manner for an overall period of time necessary to remove a required amount of the target material exposed on the substrate.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Methods and systems are disclosed herein for improvement in plasma etching of material from a substrate in a semiconductor device fabrication process. In an example embodiment, the term substrate as used herein refers to a semiconductor wafer. However, it should be understood that in other embodiments, the term substrate as used herein can refer to substrates formed of sapphire, GaN, GaAs or SiC, or other substrate materials, and can include glass panels/substrates, metal foils, metal sheets, polymer materials, or the like. Also, in various embodiments, the substrate as referred to herein may vary in form, shape, and/or size. For example, in some embodiments, the substrate as referred to herein may correspond to a 200 mm (millimeters) semiconductor wafer, a 300 mm semiconductor wafer, or a 450 mm semiconductor wafer. Also, in some embodiments, the substrate as referred to herein may correspond to a non-circular substrate, such as a rectangular substrate for a flat panel display, or the like, among other shapes.

Figure 1A:
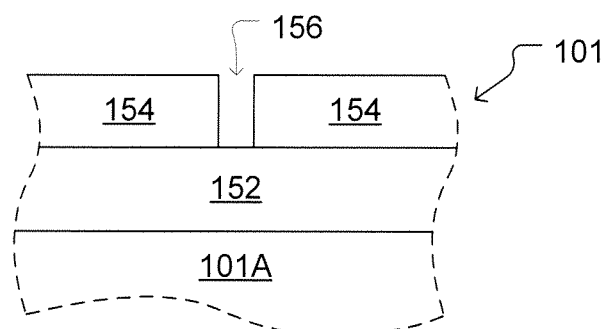
FIG. 1A shows a vertical cross-section through a portion of an example substrate prepared for a plasma etching process, in accordance with some embodiments of the present invention.

FIG. 1A shows a vertical cross-section through a portion of an example substrate 101 prepared for a plasma etching process, in accordance with some embodiments of the present invention. It should be understood that the substrate 101 is built up of multiple layers of different conductor and insulator/dielectric materials of specific shapes to form transistor devices and wires connecting various terminals and gates of the transistors devices so as to form a prescribed integrated circuit. For ease of description, base 101A of the substrate 101 represents this collective build-up of multiple layers of different materials to a particular point at which additional structures are to be formed.

FIG. 1A shows a layer of a target material 152 disposed over the base 101A of the substrate 101, with a layer of a mask material 154 disposed over the target material 152. An opening 156 is formed through the mask material 154 to expose an area of the underlying target material 152. With this configuration, a plasma etching process is performed to remove a portion of the target material 152 exposed at the bottom of the opening 156.

Figure 1B:
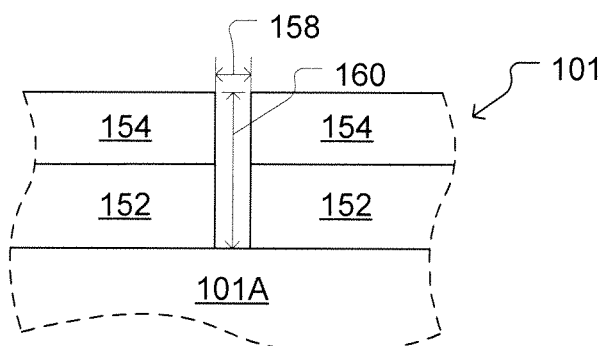
FIG. 1B shows the vertical cross-section through the portion of the example substrate from FIG. 1A, following performance of the plasma etching process.

FIG. 1B shows the vertical cross-section through the portion of the example substrate 101 from FIG. 1A, following performance of the plasma etching process. FIG. 1B shows removal of the portion of the target material 152 that was exposed through the opening 156 to the plasma etching process. The opening corresponding to the removed portion of the target material 152 has an overall opening height 160 extending through both the mask material 154 and the target material 152 and an opening width 158. The opening width 158 may correspond to a critical dimension (CD) of an integrated circuit layout. The ratio of the opening height 160 to the opening width 158 defines an aspect ratio of the opening.

In modern semiconductor device fabrication, high aspect ratio (HAR) etching has become a significant challenge. For example, in conductor etching processes, HAR etching of carbon is a particular challenge, but just one of many extant HAR-related challenges. In HAR etching processes, a trade-off is generally made between etch rate of the target material 152 and etching selectivity of the target material 152 relative to the mask material 154 overlying the target material 152. More specifically, it may be necessary to sacrifice some amount of etching selectivity of the target material 152 relative to the overlying mask material 154 in order to increase etch rate of the target material 152. Also, in some etching processes, a higher bias voltage is applied at the substrate 101 level to attract charged constituents, e.g., ions, from the plasma toward the substrate 101 in a more direct manner in order to achieve a faster etch rate of the target material 152 and correspondingly better aspect ratio dependent etch (ARDE) of the target material 152. However, in some processes, etching selectivity of the target material 152 relative to the mask material 154 can drop off rapidly with application of increasing bias voltage at the substrate 101 level.

In some etching applications, a high voltage bias pulsing (HVBP) etching process is performed with low duty cycles, e.g., less than 50% high voltage bias applied at the substrate 101 level versus zero bias voltage applied, to improve etching selectivity of the target material 152 relative to the mask material 154. However, experience indicates that with HAR geometries, the etch rate of the target material 152 becomes very low (even approaching zero) as the aspect ratio increases when zero bias voltage is present at the substrate 101 level. Additionally, besides the trade-off between etch rate of the target material 152 and etching selectivity of the target material 152 relative to a mask material 154, there can be other issues related to HVBP and/or continuous wave (CW) etching processes, such as difficulty with profile control, hole distortion, and/or top clogging. For example, with thicker carbon mask material layers and smaller critical dimension for next generation three-dimensional NAND devices, improved methods and systems such as those described herein are needed to meet process specifications regarding etch rate, target versus mask selectivity, profile control, hole distortion, and/or top clogging, among others.

Figure 2:
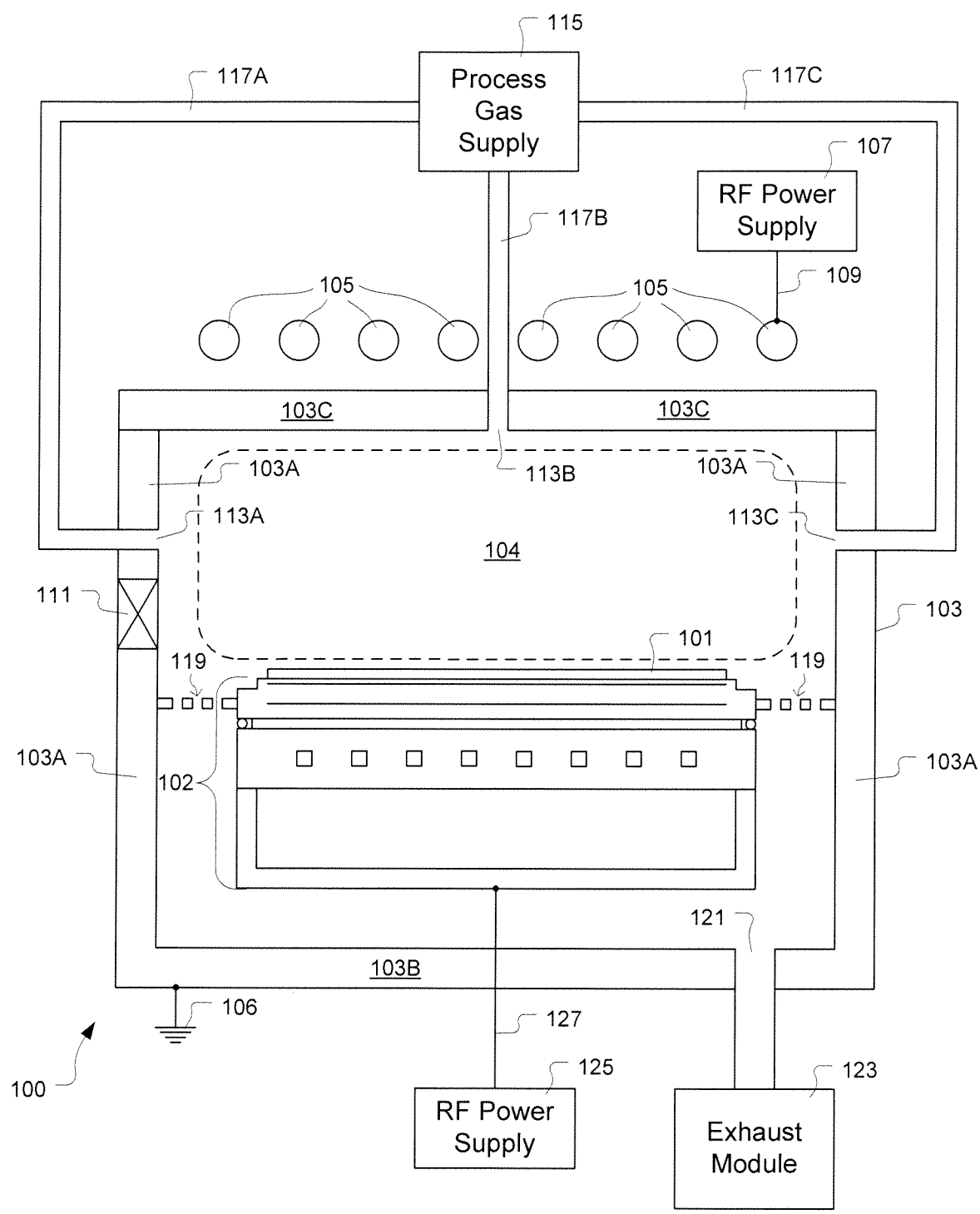
FIG. 2 shows an example substrate process module, in accordance with various embodiments of the present invention.

FIG. 2 shows an example substrate process module 100, in accordance with various embodiments of the present invention. The process module 100 includes a substrate holder 102 configured to hold the substrate 101 in exposure to a plasma processing environment in which a plasma 104 is generated. The present disclosure primarily concerns apparatuses, systems, and methods by which one or more process parameters of bias voltage, primary coil power, and bias voltage RF signal frequency are systematically controlled to improve HAR etching of the target material 152 without compromising the overlying mask material 154. To provide example context, the process module 100 is depicted as an inductively coupled plasma (ICP) process module. However, it should be understood that in other embodiments the process module 100 can be defined as other types of process modules used in semiconductor fabrication.

The process module 100 is configured to provide for exposure of the substrate 101 to a plasma-based processing operation in order to modify characteristics of the substrate 101 in a prescribed and controlled manner. The process module 100 includes a chamber 103 defined by surrounding structures, including one or more wall structures 103A, a bottom structure 103B, and a top structure 103C. In some embodiments, the top structure 103C is formed of a material through which RF signals can be transmitted, such as quartz or ceramic, among others. The chamber 103 can be formed of an electrically conductive material and have an electrical connection to a reference ground potential 106.

The process module 100 includes a coil assembly 105 disposed above the top structure 103C. An RF power supply 107 is connected to supply RF power (RF signals) to the coil assembly 105 through a connection 109. The RF power supplied to the coil assembly 105 is referred to as primary coil power herein. In various embodiments, the RF power supply 107 includes one or more RF generators and associated impedance matching circuitry to provide for proper transmission of the RF power to coil assembly 105.

In various embodiments, the RF power supply 107 can include one or more RF signal generators operating at one or more frequencies. Multiple RF signal frequencies can be supplied to the coil assembly 105 at the same time. In some embodiments, signal frequencies output by the RF power supply 107 are set within a range extending from 1 kHz (kiloHertz) to 100 MHZ (megaHertz). In some embodiments, signal frequencies output by the RF power supply 107 are set within a range extending from 400 kHz to 60 MHz. In some embodiments, the RF power supply 107 is set to generate RF signals at frequencies of 2 MHZ, 27 MHz, and 60 MHz. In some embodiments, the RF power supply 107 is set to generate one or more high frequency RF signals within a frequency range extending from about 2 MHz to about 60 MHZ, and generate one or more low frequency RF signals within a frequency range extending from about 100 kHz to about 2 MHz. It should be understood that the above-mentioned RF signal frequency ranges are provided by way of example. In practice, the RF power supply 107 can be configured to generate essentially any RF signal having essentially any frequency as needed to generate the plasma 104 within the chamber 103. Additionally, the RF power supply 107 can include frequency-based filtering, i.e., high-pass filtering and/or low-pass filtering, to ensure that specified RF signal frequencies are transmitted to the coil assembly 105.

In some embodiments, the process module 100 includes a closable access port 111, such as a gate valve or other component, through which the substrate 101 can be transferred into and out of the chamber 103. The process module 100 also includes a number of process gas supply ports 113A, 113B, 113C through which one or more process gas composition(s) can be supplied to the interior region of the chamber 103 overlying the substrate holder 102. During operation, a process gas supply 115 operates to deliver the one or more process gas composition(s) through one or more connection lines 117A, 117B, 117C to the process gas supply ports 113A, 113B, 113C, respectively, and RF power is delivered from the RF power supply 107 to the coil assembly 105, such that the RF power generates an electromagnetic field within a plasma generation region below the top structure 103C and overlying the substrate holder 102 so as to transform the one or more process gas composition(s) within the plasma generation region into the plasma 104. Then, reactive constituents of the plasma 104, such as ions and/or radicals, interact with portions of the exposed surfaces of the substrate 101.

The process module 100 includes a number of side vent structures 119 through which gases and by-product materials can flow to an exhaust port 121, which is connected to an exhaust module 123 configured to apply a negative pressure to the interior of the chamber 103 to facilitate exhaust of the used process gases and by-product materials. Also, in some embodiments, the substrate holder 102 is configured to receive bias RF power from a bias RF power supply 125 through a connection 127 to provide for generation of a bias voltage on the substrate holder 102 in order to attract ions from the plasma 104 toward the substrate holder 102 and substrate 101 held thereon. In various embodiments, the RF power supply 125 includes one or more RF generators and associated impedance matching circuitry to provide for proper transmission of the RF power to substrate holder 102.

In various embodiments, the RF power supply 125 can include one or more RF signal generators operating at one or more frequencies. Multiple RF signal frequencies can be supplied to the substrate holder 102 at the same time. In some embodiments, signal frequencies output by the RF power supply 125 are set within a range extending from 1 kHz (kiloHertz) to 100 MHZ (megaHertz). In some embodiments, signal frequencies output by the RF power supply 125 are set within a range extending from 400 KHz to 60 MHz. In some embodiments, the RF power supply 125 is set to generate RF signals at frequencies of 2 MHZ, 27 MHz, and 60 MHz. In some embodiments, the RF power supply 125 is set to generate one or more high frequency RF signals within a frequency range extending from about 2 MHz to about 60 MHZ, and generate one or more low frequency RF signals within a frequency range extending from about 100 kHz to about 2 MHz. It should be understood that the above-mentioned RF signal frequency ranges are provided by way of example. In practice, the RF power supply 125 can be configured to generate essentially any RF signal having essentially any frequency as needed to generate a prescribed bias voltage at the substrate 101. Additionally, the RF power supply 125 can include frequency-based filtering, i.e., high-pass filtering and/or low-pass filtering, to ensure that specified RF signal frequencies are transmitted to the substrate holder 102.

Although the process module 100 depicts an example of an ICP process module, in various embodiments, the process module 100 can be essentially any type of process module used in semiconductor device fabrication. For example, in some embodiments, the process module 100 can be a capacitively coupled plasma (CCP) process module in which, instead of the coil assembly 105 used in the ICP process module, the CCP process module includes one or more electrodes disposed within the chamber 103, with RF power delivered to the one or more electrodes. In the CCP process module, the one or more electrodes can include one or more of a top electrode (e.g., a showerhead electrode or solid electrode, among others), a bottom electrode (e.g., an electrostatic chuck or substrate support, among others), and a side electrode (e.g., a peripheral ring-shaped electrode, among others), where the top, bottom, and side electrodes are configured around the plasma generation region. The RF power delivered to the one or more electrodes of the CCP process module is transmitted from the one or more electrodes through the one or more process gas composition(s) present within the plasma generation region to a reference ground potential, and in doing so transforms the one or more process gas composition(s) within the plasma generation region into the plasma 104.

It should be understood that the ICP and CCP process module examples mentioned above are discussed in a simplified manner for ease of description. In reality, the process module 100, whether ICP, CCP, or some other type, is a complex system that includes many components not described herein. However, what should be appreciated for the present discussion is that the process module 100, regardless of type, includes the substrate holder 102 configured to hold the substrate 101 in a secured manner in exposure to the plasma 104 to enable processing of the substrate 101 to obtain a specific result. Examples of plasma processing operations that may performed by the process module 100 include etching operations, deposition operations, and ashing operations, among others.

With regard to the substrate 101, the mask material 154 and target material 152 are selected such that the mask material 154 and target material 152 have different etching mechanisms. Specifically, the mask material 154 is selected to be resistant to chemical etching, such that etching of the mask material 154 is ion-driven. In some embodiments, the mask material 154 is selected such that removal of the mask material 154 in a given plasma etching process will primarily occur through sputtering mechanisms. Examples of the mask material 154 include $SiO_2$, SIN, SiON, Si-ARC, among others. In contrast to the mask material 154, the target material 152 is selected to be subject to chemical etching, such that etching of the target material 152 is both chemically-driven and ion-assisted. Etching of the target material 152 can be enhanced through ion interaction with the target material 152. Thus, ion-assisted chemical etching processes will be effective in removing the exposed portion of the target material 152. Examples of the target material 152 include photoresist material, carbon material, doped carbon material, carbon doped material, silicon material, various metals (such as tungsten, titanium, etc.), among others.

It should be understood that the mask material 154 is resistant to chemical etching and subject to ion-driven etching, while the target material 152 is subject to both chemical etching and ion-assisted etching. In some embodiments, the target material 152 will be composed of chemical components that are different than chemical components present in the mask material 154. The mask material 154 and target material 152 can be essentially any materials that have the above-mentioned etching characteristics in exposure to a particular plasma composition to be used.

The mask material 154 is also configured such that ions incident upon the mask material 154 will need to have a threshold amount of kinetic energy in order to remove mask material 154 through a sputtering reaction. This threshold amount of ion kinetic energy required for sputtering of the mask material 154 corresponds to a threshold bias voltage applied at the substrate 101, due to the direct correlation between the kinetic energy of the ions incident upon the mask material 154 and the applied bias voltage at the substrate 101 level. During the plasma etching process, because the mask material 154 is not subject to chemical etching, when the applied bias voltage is below the threshold bias voltage for removal of the mask material 154, there is essentially no removal of mask material 154 due to interaction of the plasma constituents (radicals/ions) with the mask material 154, regardless of the ion density present near the mask material 154. More specifically, when the applied bias voltage is less than the threshold bias voltage for removal of the mask material 154, an increase in the ion density within the plasma near the substrate 101 will not affect the etch rate of the mask material 154. However, when the applied bias voltage exceeds the threshold bias voltage for removal of the mask material 154, the etch rate of the mask material 154 will increase in a substantially linear manner with increase in the applied bias voltage. And, when the applied bias voltage exceeds the threshold bias voltage for removal of the mask material 154, an increase in the ion density within the plasma near the substrate may cause an increase in the etch rate of the mask material 154.

Figure 3A:
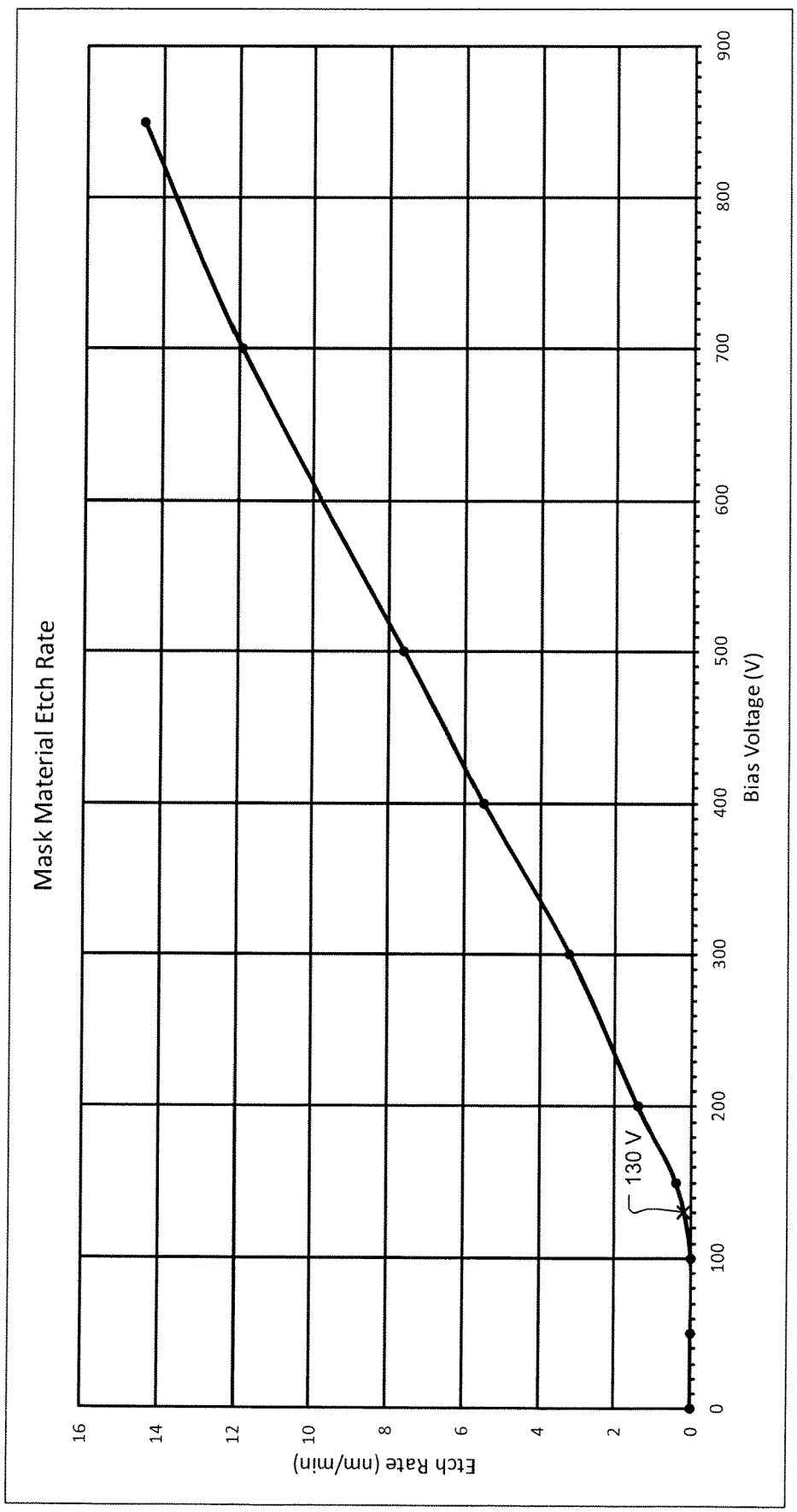
FIG. 3A shows an example plot of etch rate versus applied bias voltage for a blanket silicon oxide mask material disposed on a substrate, in accordance with some embodiments of the present invention.

FIG. 3A shows an example plot of etch rate versus applied bias voltage for a blanket silicon oxide mask material 154 disposed on a substrate, in accordance with some embodiments of the present invention. The example of FIG. 3A corresponds to exposure of the blanket silicon oxide mask material 154 to a plasma etching process in which the plasma is generated using a process gas mixture of 900 sccm (standard cubic centimeters per minute) $O_2$ and 100 sccm COS. As shown in the example of FIG. 3A, the threshold bias voltage for removal of the mask material 154 is about 130 V. Below the threshold bias voltage of 130 V, the etch rate of the mask material 154 is essentially zero. Above the threshold bias voltage of 130 V, the etch rate of the mask material 154 increases in a substantially linear manner with the applied bias voltage.

Figure 3B:
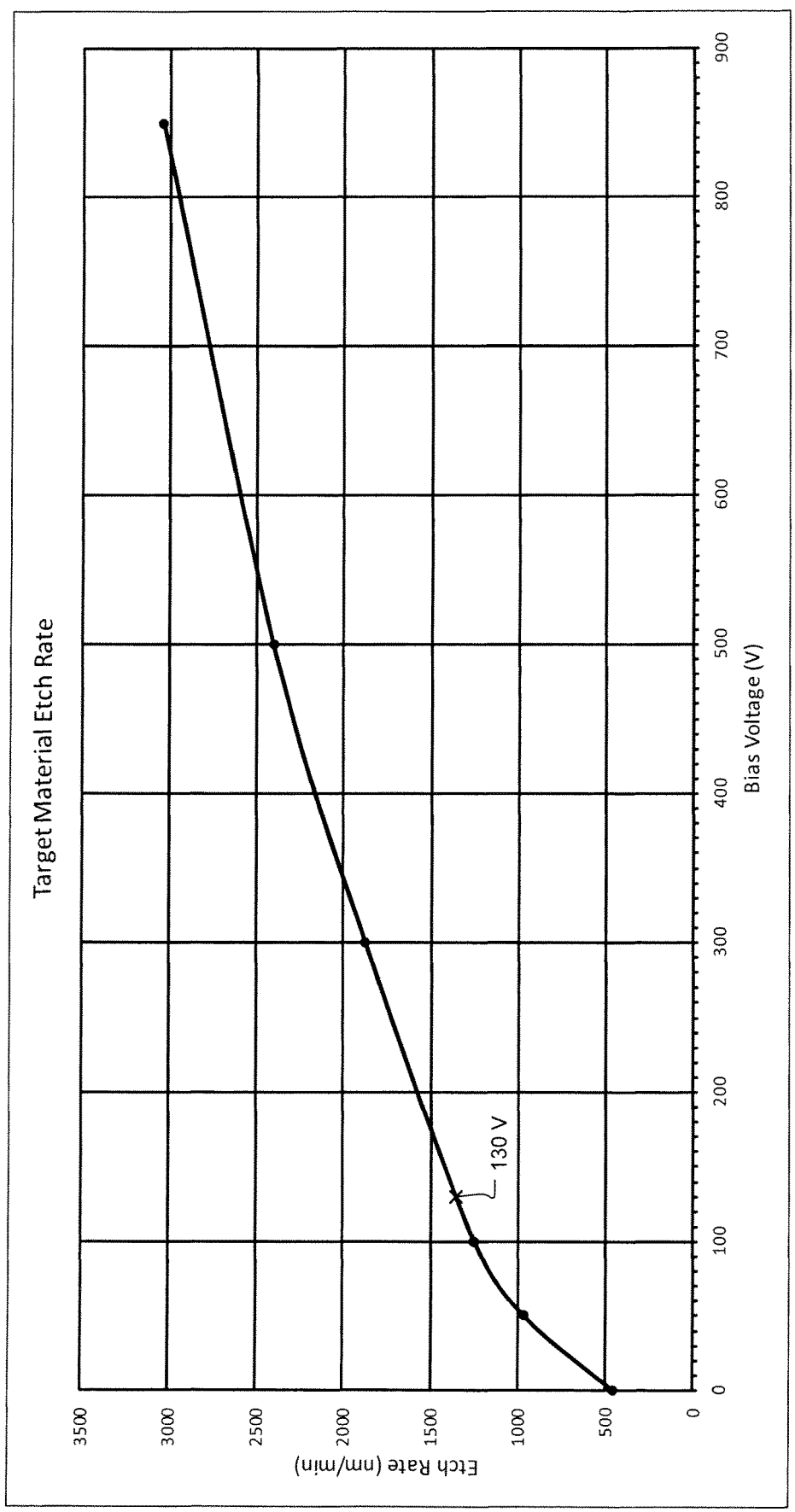
FIG. 3B shows an example plot of etch rate versus applied bias voltage for a blanket photoresist target material disposed on a substrate, in accordance with some embodiments of the present invention.

Unlike the mask material 154, the target material 152 will etch chemically without bias voltage applied at the substrate 101 level. However, as the bias voltage is increased from zero, the target material 152 etch rate will increase due to increased ion interaction with the target material 152. Also, an increase in the ion density within the plasma near the substrate will cause an increase in the etch rate of the target material 152. FIG. 3B shows an example plot of etch rate versus applied bias voltage for a blanket photoresist target material 152 disposed on a substrate, in accordance with some embodiments of the present invention. As with FIG. 3A, the example of FIG. 3B also corresponds to exposure of the blanket photoresist target material 152 to the plasma etching process in which the plasma is generated using the process gas mixture of 900 sccm (standard cubic centimeters per minute) $O_2$ and 100 sccm COS. As shown in FIG. 3B, the target material 152 etches through chemical reactions with constituents of the plasma with zero bias voltage applied at the substrate level. And, as the applied bias voltage is increased from zero, the etch rate of the target material 152 correspondingly increases. Therefore, as the applied bias voltage is increased from zero to the threshold bias voltage for removal of the mask material 154, the etch rate of the target material 152 will correspondingly increase while the etch rate of the mask material 154 remains essentially zero.

Also, as the applied bias voltage increases, the etch front moves more directly toward the substrate due to the stronger attraction of the ions from the plasma directly toward the substrate. Therefore, if the applied bias voltage is set near the threshold bias voltage for removal of the mask material 154, the integrity of the mask material 154 will be maintained while the target material 152 will be etched with more directionality toward the substrate holder as compared to when the applied bias voltage is set lower. With a higher applied bias voltage, the etch rate of the target material 152 will be higher and adverse distortion of the etched feature will be reduced. Given the foregoing, an etching process window includes an applied bias voltage range extending from 0 V to the threshold bias voltage for removal of the mask material 154. Within this etching process window, the bias voltage can be controlled to optimize ion-assisted etching of the target material 152, particularly for HAR applications, without compromising integrity of the mask material 154. Methods are disclosed herein for exploiting the different etch responses of the mask material 154 and target material 152 to attain advanced ion control in order to achieve a faster etch rate of the target material 152, and achieve a higher etching selectivity of the target material 152 relative to the mask material 154, and achieve a better profile of the etched feature, and achieve less hole distortion of the etched feature.

Figure 4A:
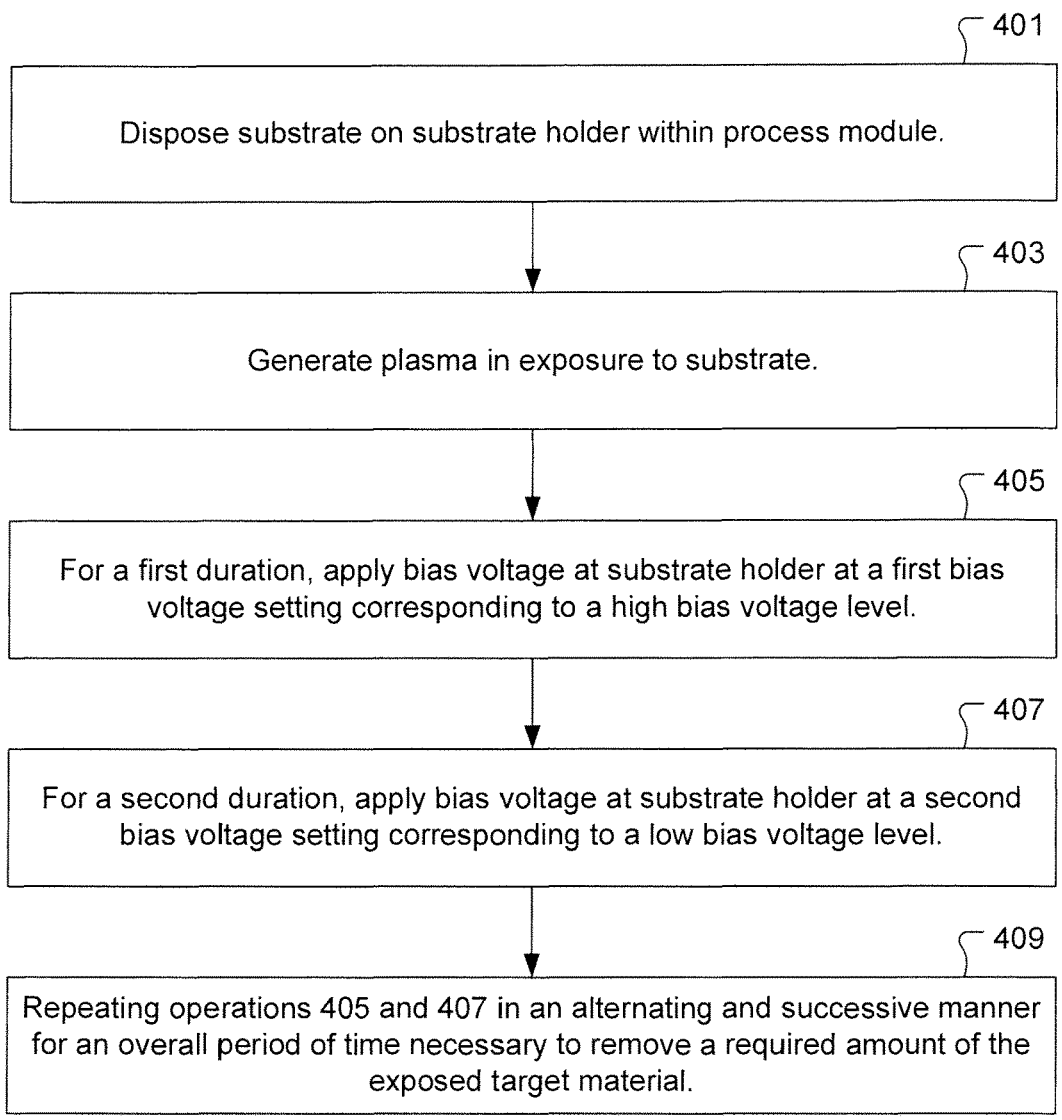
FIG. 4A shows a flowchart of a method for providing advanced ion control to improve etching of target material, in accordance with some embodiments of the present invention.

FIG. 4A shows a flowchart of a method for providing advanced ion control to improve etching of target material 152, in accordance with some embodiments of the present invention. With reference to FIG. 2, the method includes an operation 401 in which a substrate 101 is disposed on a substrate holder 102 within a process module 100 to be subjected to a plasma etching process. As exemplified in FIG. 1A, the substrate 101 includes the mask material 154 disposed over the target material 152, with portions of the target material 152 exposed through openings in the mask material 154. The method also includes an operation 403 for generating a plasma in exposure to the substrate 101, with the plasma including ions and reactive constituents such as radicals. The method also includes an operation 405 for applying bias voltage at the substrate holder 102 at a first bias voltage setting corresponding to a high bias voltage level. In some embodiments, the first bias voltage setting is within a range extending from about 400 V to about 3000 V. The first bias voltage setting is greater than the threshold bias voltage for removal of the mask material 154. The operation 405 is performed for a first duration and corresponds to a first process state (A).

From the operation 405, the method proceeds with an operation 407 in which the bias voltage applied at the substrate holder 102 is set at a second bias voltage setting corresponding to a low bias voltage level. The operation 407 is performed for a second duration and corresponds to a second process state (B). The second bias voltage setting is greater than zero. The second bias voltage setting is either 1) less than the threshold bias voltage for removal of the mask material 154 such that essentially no mask material 154 is removed during application of the second bias voltage setting, or 2) substantially near the threshold bias voltage for removal of the mask material 154 such that an insignificant amount of the mask material 154 is removed during application of the second bias voltage setting. In some embodiments, the second bias voltage setting is within a range extending from about 20 V to about 300 V, depending on the threshold bias voltage for removal of the mask material 154. In some embodiments, the high end of the range for the second bias voltage setting, i.e., for the low bias voltage level, is set at or just above the threshold bias voltage for removal of the mask material 154. The method also includes an operation 409 for repeating operation 405 and 407 in an alternating and successive manner for an overall period of time necessary to remove a required amount of the exposed target material 152.

Figure 4B:
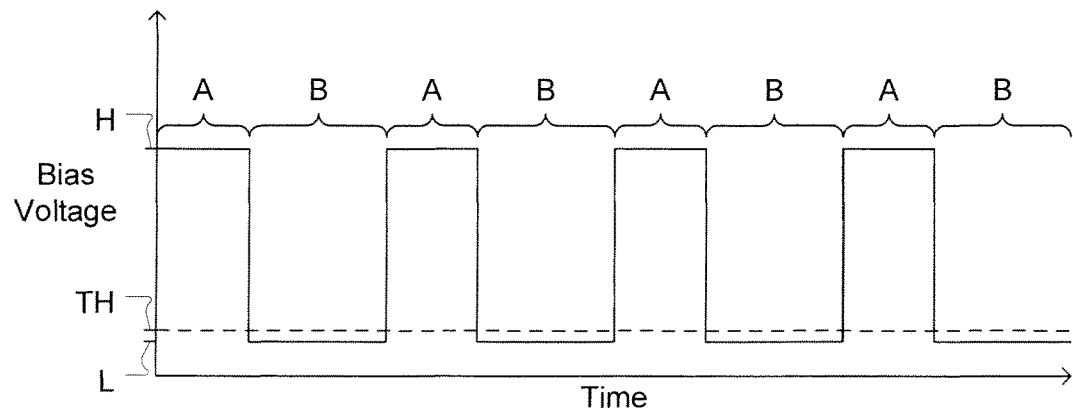
FIG. 4B shows an example plot of bias voltage versus time corresponding to the method of FIG. 4A, in accordance with some embodiments of the present invention.

FIG. 4B shows an example plot of bias voltage versus time corresponding to the method of FIG. 4A, in accordance with some embodiments of the present invention. The first bias voltage setting (H) is the high bias voltage level of operation 405 and corresponds to the first process state (A). The second bias voltage setting (L) is the low bias voltage level of operation 407 and corresponds to the second process state (B). The second bias voltage setting (L) is near the threshold bias voltage (TH) for removal of the mask material 154. According to operation 409, the bias voltage is successively alternated between the first process state A and the second process state B. In some embodiments, the duration of the first process state (A) is less than the duration of the second process state (B). However, in some embodiments, the duration of the first process state (A) is greater than the duration of the second process state (B). And, in some embodiments, the duration of the first process state (A) is substantially equal to the duration of the second process state (B). It should be understood that the mask material 154 is preserved during the second process state (B), and the mask material 154 is removed during the first process state (A). Therefore, in various embodiments, the respective durations of process states (A) and (B) are set and controlled such that the mask material 154 will endure through the entirety of the plasma etching process to reach the end condition of having removed the required amount of exposed target material 152, and such that removed portions of the mask material 154 will not interfere with or adversely impact continuation of the plasma etching process prior to reaching the end condition.

It should be understood that the first process state (A), in which the bias voltage setting is at the high bias voltage level, provides for rapid etch rate of the target material 152 and control of etched feature distortion. It should also be understood that the second process state (B), in which the bias voltage setting is at the low bias voltage level, provides for control of etching selectivity of the target material 152 relative to the mask material 154 while maintaining an effective etch rate of the target material 154. Additionally, it should be appreciated that the method of FIG. 4A provides for better overall etch rate of the target material 152 as compared to a different method in which the bias voltage goes to zero in the second process state (B).

In some embodiments of the method of FIG. 4A, the respective durations of process states (A) and (B) are set on the order of seconds. These embodiments are referred to as advanced mixed-mode pulsing (aMMP) methods for plasma etching. During the aMMP methods, the plasma is maintained in a continuous manner as the bias voltage is changed in the different process states (A) and (B). In various embodiments, the plasma is generated to enable realization of the differentiated etching mechanisms of the mask material 154 and the target material 152 as discussed above. In some example embodiments, the plasma can be generated using a process gas mixture that includes oxygen with an added passivation gas such as a carbon polymer and/or sulfur polymer. For example, in some embodiments, a process gas mixture of 1000 sccm $O_2$ and 100 sccm COS is used to generate the plasma. It should be understood, however, that in other embodiments, the plasma can be generated using essentially any other process gas mixture, so long as the differentiated etching mechanisms of the mask material 154 and the target material 152 are realized. Also, with reference to FIG. 2, in various embodiments, the flow rate of the process gas mixture within the chamber 103 is set as needed to enable generation and stabilization of the plasma. In some example embodiments, a pressure within the chamber 103 is maintained within a range extending from about 2 milliTorr (mTorr) to about 100 mTorr. Alternately, in some example embodiments, the pressure within the chamber 103 is maintained within a range extending from about 10 milliTorr (mTorr) to about 30 mTorr. Also, with reference to FIG. 2, in some example embodiments, the primary coil power supplied to the coil assembly 105 is within a range extending from about 100 Watts (W) to about 5000 W.

In some embodiments of the method of FIG. 4A, the process states (A) and (B) correspond to respective portions of a same bias voltage pulse cycle, with the bias voltage pulsed at a frequency on the order of the frequency of the RF signals transmitted to generate the bias voltage. These embodiments are referred to as modified high voltage bias pulsing (mHVBP) methods for plasma etching. Therefore, in the mHVBP methods, each bias voltage pulse cycle includes a high bias voltage duration corresponding to process state (A) and a low bias voltage duration corresponding to process state (B). In some embodiments, the mHVBP methods include level-to-level pulsing of the bias voltage in a frequency range extending from about 10 Hertz (Hz) up to several kiloHertz (kHz). Therefore, in the mHVBP methods, the respective durations of process states (A) and (B) are on time scales of less than 0.1 millisecond (ms) and less than 100 ms. Thus, the respective durations of process states (A) and (B) in the mHVBP methods are about 1000 times shorter than the respective durations of process states (A) and (B) in the aMMP methods. Also, it should be understood that during the mHVBP methods, the plasma is maintained in a continuous manner as the bias voltage is changed in the different process states (A) and (B).

In the mHVBP methods, the first bias voltage setting corresponding to the high bias voltage level in process state (A) is greater than the threshold bias voltage for removal of the mask material 154. And, in the mHVBP methods, the second bias voltage setting corresponding to the low bias voltage level in process state (B) is greater than zero, but not significantly greater than the threshold bias voltage for removal of the mask material 154, such that essentially no mask material 154 is removed during the process state (B). During the mHVBP method, the bias voltage is maintained at a non-zero level. In other words, the mHVBP method disclosed herein does not include a state in which the bias voltage is zero, i.e., turned off. The mHVBP method represents a dual-level bias voltage pulsing method for providing advanced ion control to enable etching of more target material 152 without losing more mask material 154, while increasing etch rate of the target material 152 and increasing etching selectivity of the target material 152 relative to the mask material 154.

In some embodiments, the method of FIG. 4A can be implemented in a manner in which the process state (B) corresponds to a low bias voltage continuous wave (CW) process, with the process state (A) corresponding to addition of high bias voltage spikes on top of the low bias CW process. In this manner, process state (B) is actually a baseline of the process, and the process state (A) is generated by introducing high bias voltage spikes is an additive manner. In some embodiments, the high bias voltage spikes corresponding to process state (A) are introduced with a duty cycle of less than 10%, meaning that the duration of process state (A) is less than 10% of the sum of the durations of process steps (A) and (B). In these embodiments, the addition of the high bias voltage spikes may improve the etch profile control and provide other process benefits related to high bias voltage, with minor loss of etching selectivity of the target material 152 relative to the mask material 154.

Figure 5A:
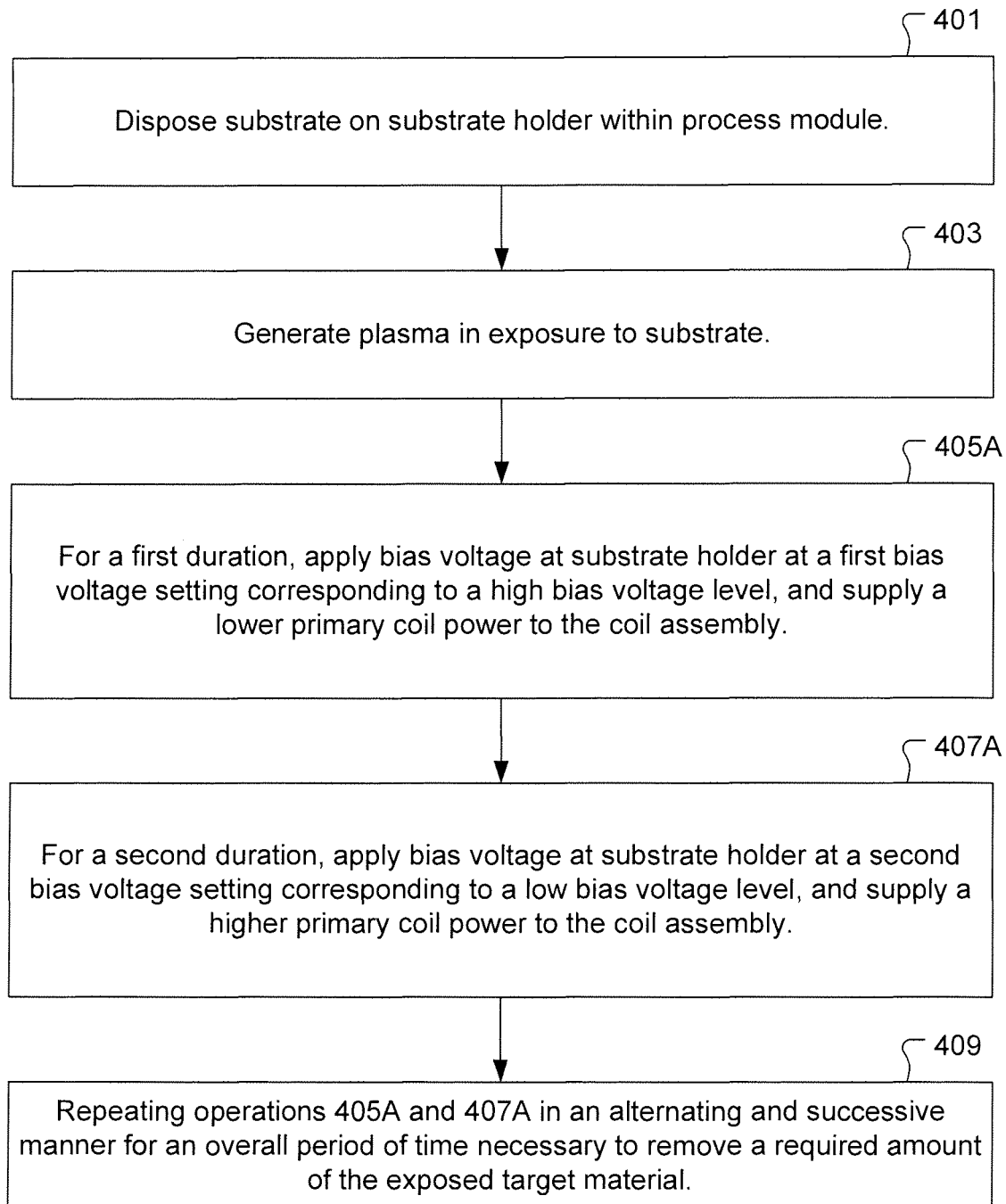
FIG. 5A shows a flowchart of a method for providing advanced ion control to improve etching of target material, in accordance with some embodiments of the present invention.

FIG. 5A shows a flowchart of a method for providing advanced ion control to improve etching of target material, in accordance with some embodiments of the present invention. The method of FIG. 5A is an extension of the method of FIG. 4A. Specifically, the method of FIG. 5A includes operations 401, 403, and 409 as previously described with regard to FIG. 4A. However, in place of the operations 405 and 407 of FIG. 4A, the method of FIG. 5A includes modified operations 405A and 407A, respectively. In the operation 405A, for the first duration corresponding to the first process state (A), the bias voltage is applied at the substrate holder 102 at the first bias voltage setting corresponding to the high bias voltage level, and a lower primary coil power is supplied to the coil assembly 105. In some embodiments, the first bias voltage setting is within a range extending from about 400 V to about 3000 V. The first bias voltage setting is greater than the threshold bias voltage for removal of the mask material 154. In some embodiments, the lower primary coil power is within a range extending from about 50 W to about 2000 W. The lower primary coil power in the first process state (A) corresponds to a lower ion density within the plasma. Therefore, in the first process state (A), when the mask material 154 is subject to ion-induced sputtering, the ion density within the plasma is lower so as to reduce the number of ions available to cause the ion-induced sputtering of the mask material 154.

In the operation 407A, for the second duration corresponding to the second process state (B), the bias voltage is applied at the substrate holder 102 at the second bias voltage setting corresponding to the low bias voltage level, and a higher primary coil power is supplied to the coil assembly 105. The second bias voltage is set such that essentially zero ion-induced sputtering of the mask material 154 will occur. In some embodiments, the second bias voltage setting is within a range extending from about 20 V to about 300 V, depending on the threshold bias voltage for removal of the mask material 154. In some embodiments, the higher primary coil power is within a range extending from about 2000 W to about 5000 W. The higher primary coil power in the second process state (B) corresponds to a higher ion density within the plasma. Therefore, in the second process state (B), when the mask material 154 is not subject to ion-induced sputtering, the ion density within the plasma is higher so as to increase the number of ions available for etching of the target material 152. In some embodiments, the etch rate of the target material 152 is directly proportional to the ion density within the plasma.

Figure 5B:
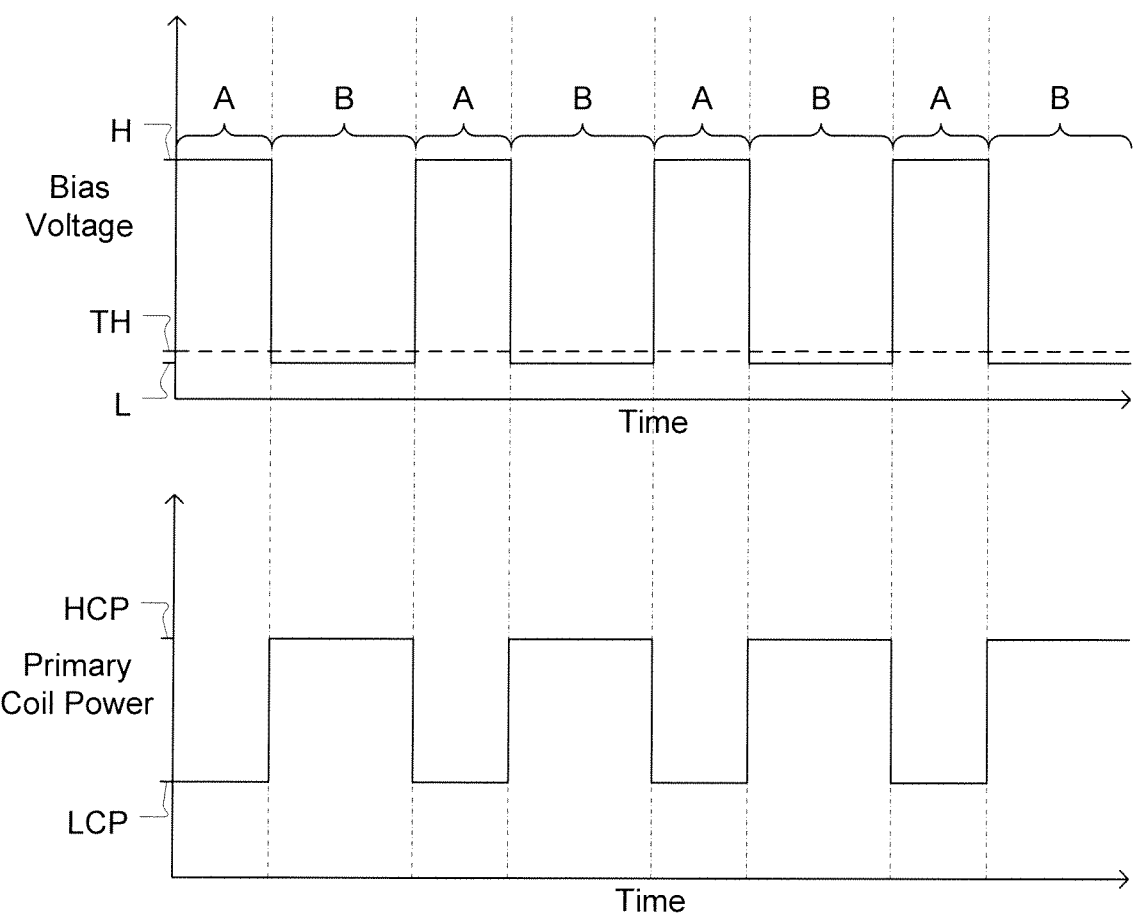
FIG. 5B shows an example plot of primary coil power versus time corresponding to the method of FIG. 5A in combination with the example plot of bias voltage versus time from FIG. 4B, in accordance with some embodiments of the present invention.

FIG. 5B shows an example plot of primary coil power versus time corresponding to the method of FIG. 5A in combination with the example plot of bias voltage versus time from FIG. 4B, in accordance with some embodiments of the present invention. As shown in FIG. 5B, the primary coil power changes from the lower primary coil power (LCP) in process state (A) to the higher coil power (HCP) in process step (B) to the lower primary coil power (LCP) in process state (A), and so on. As shown in FIG. 5B, the method of FIG. 5A corresponds to pulsing of the primary coil power and bias voltage in a synchronous inverted relationship to each other.

In the method of FIG. 5A, the ion density within the plasma is increased in accordance with having the bias voltage set below the threshold bias voltage for ion-induced etching of the mask material 154. In this manner, the etch rate of the target material 152 is increased by way of the increased ion density, while the mask material 154 does not etch due to the bias voltage being near or lower than the threshold bias voltage for ion-induced etching of the mask material 154. With the method of FIG. 5A, the etch rate of the target material 152 is increased without further loss of mask material 154. Also, with the method of FIG. 5A, the etching selectivity of the target material 152 relative to the mask material 154 is increased, and adverse distortion of the etched feature is decreased.

Figure 6A:
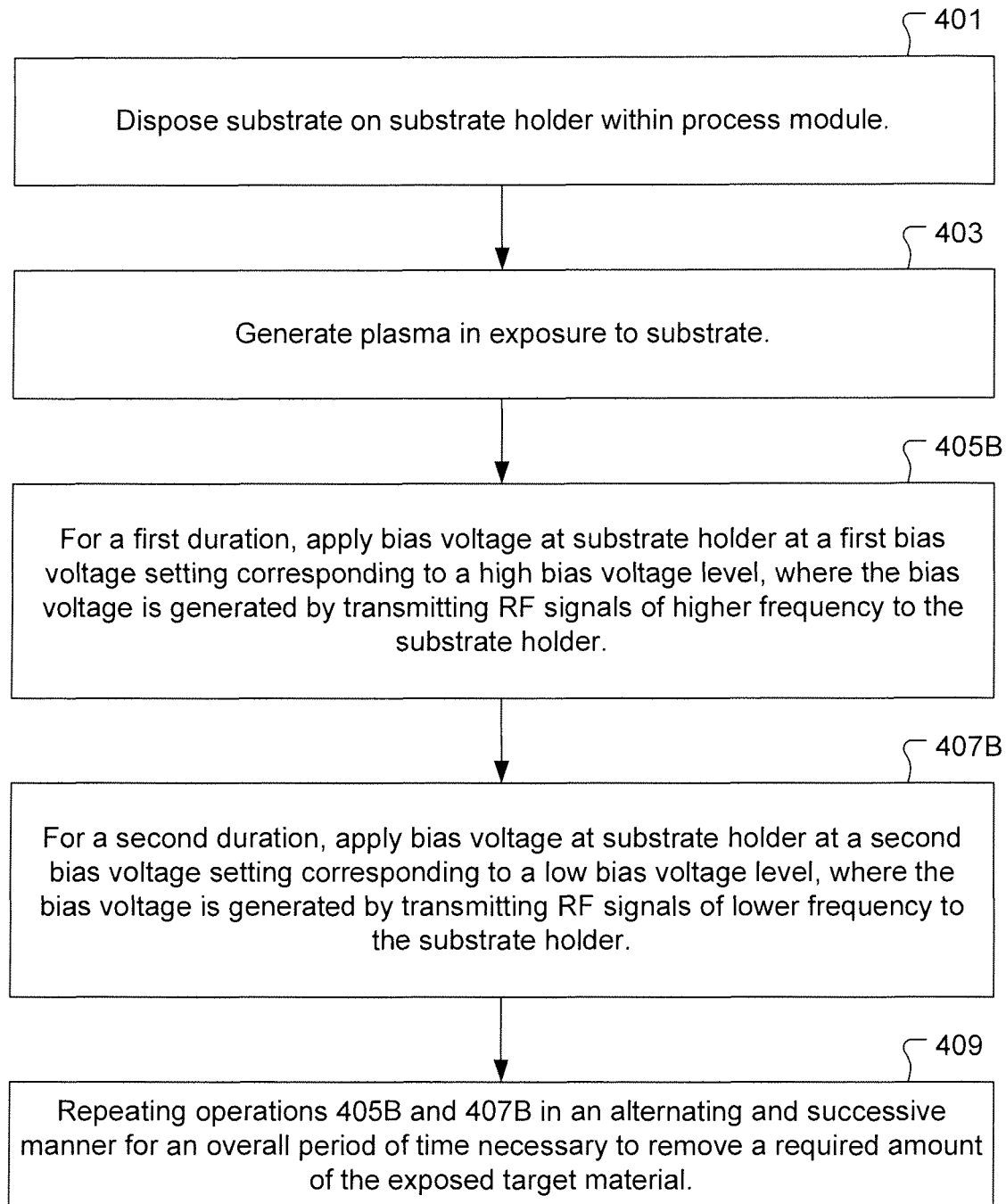
FIG. 6A shows a flowchart of a method for providing advanced ion control to improve etching of target material, in accordance with some embodiments of the present invention.

FIG. 6A shows a flowchart of a method for providing advanced ion control to improve etching of target material, in accordance with some embodiments of the present invention. The method of FIG. 6A is an extension of the method of FIG. 4A. Specifically, the method of FIG. 6A includes operations 401, 403, and 409 as previously described with regard to FIG. 4A. However, in place of the operations 405 and 407 of FIG. 4A, the method of FIG. 6A includes modified operations 405B and 407B, respectively. In the operation 405B, for the first duration corresponding to the first process state (A), the bias voltage is applied at the substrate holder 102 at the first bias voltage setting corresponding to the high bias voltage level, where the bias voltage is generated by transmitting RF signals of higher frequency to the substrate holder 102. In some embodiments, the first bias voltage setting is within a range extending from about 400 V to about 3000 V. The first bias voltage setting is greater than the threshold bias voltage for removal of the mask material 154. In some embodiments, the RF signals transmitted to generate the first bias voltage setting corresponding to the high bias voltage level have a frequency of about 13.56 megaHertz (MHz), which represents an example higher frequency. It should be understood, however, that in other embodiments, the higher RF signal frequency used to generate the first bias voltage setting corresponding to the high bias voltage level is within a range extending from about 13 MHz to about 60 MHz. When the bias voltage is generated using RF signals of higher frequency, the resulting ion energy distribution (IED) near the substrate 101 will exhibit a single peak distribution.

In the operation 407B, for the second duration corresponding to the second process state (B), the bias voltage is applied at the substrate holder 102 at the second bias voltage setting corresponding to the low bias voltage level, where the bias voltage is generated by transmitting RF signals of lower frequency to the substrate holder 102. The second bias voltage is set such that essentially zero ion-induced sputtering of the mask material 154 will occur. In some embodiments, the second bias voltage setting is within a range extending from about 20 V to about 300 V, depending on the threshold bias voltage for removal of the mask material 154. In some embodiments, the RF signals transmitted to generate the second bias voltage setting corresponding to the low bias voltage level have a frequency of about 2 MHz, or 1 MHz, or 400 kiloHertz (kHz), which represent examples of lower frequency. It should be understood, however, that in other embodiments, the lower RF signal frequency used to generate the second bias voltage setting corresponding to the low bias voltage level is within a range extending from about 400 kHz to about 2 MHz. When the bias voltage is generated using RF signals of lower frequency, the resulting IED near the substrate 101 will exhibit a double peak distribution, with one peak at the beginning of the distribution and one peak at the end of the distribution.

Figure 6B:
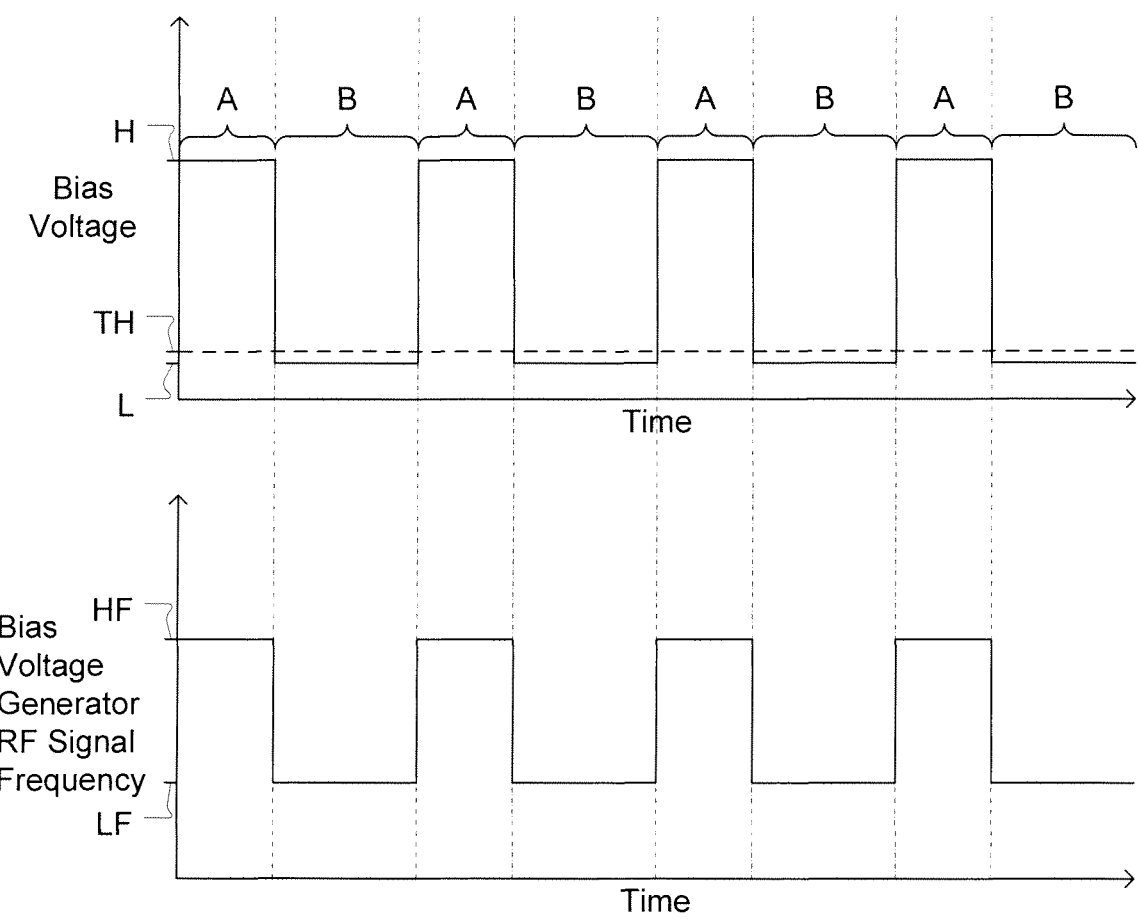
FIG. 6B shows an example plot of bias voltage generator RF signal frequency versus time corresponding to the method of FIG. 6A in combination with the example plot of bias voltage versus time from FIG. 4B, in accordance with some embodiments of the present invention.

FIG. 6B shows an example plot of bias voltage generator RF signal frequency versus time corresponding to the method of FIG. 6A in combination with the example plot of bias voltage versus time from FIG. 4B, in accordance with some embodiments of the present invention. As shown in FIG. 6B, the RF signal frequency used to generate the bias voltage changes from the higher frequency (HF) in process state (A) to the lower frequency (LF) in process step (B) to the higher frequency (HF) in process state (A), and so on. As shown in FIG. 6B, the method of FIG. 6A corresponds to changing of the bias voltage generator RF signal frequency and bias voltage in a synchronous relationship to each other.

The method of FIG. 6A takes advantage of change in the IED with change in frequency of the RF signals used to generate the bias voltage at the substrate 101. By changing the frequency of the RF signals used to generate the bias voltage, it is possible to change the IED at the substrate 101. However, if the resulting bias voltage remains below the threshold bias voltage for removal of the mask material 154, the change in IED will only effect etching of the target material 152. Use of lower frequency RF signals to generate the bias voltage corresponds to higher voltage peaks and higher average voltage. For example, due to changes in the IED with RF signal frequency, if RF signals of a single frequency are used to generate the bias voltage, it is possible to attain a higher etch rate and lower etching selectivity of the target material 152 relative to the mask material 154 by using RF signals of lower frequency to generate the second bias voltage setting corresponding to the low bias voltage level. In this manner, because the low bias voltage is near the threshold bias voltage for etching of the mask material 154, the mask material 154 will not etch regardless of the lower etching selectivity of the target material 152 relative to the mask material 154 caused by using RF signals of lower frequency to generate the bias voltage. However, RF signals of higher frequency can be used to generate the first bias voltage setting corresponding to the high bias voltage level to increase etching selectivity of the target material 152 relative to the mask material 154, and thereby reduce loss of mask material 154. It should be appreciated that by changing of the bias voltage generator RF signal frequency and bias voltage in a synchronous relationship to each other, a much wider process window is created which will extend to other process benefits.

Figure 7A:
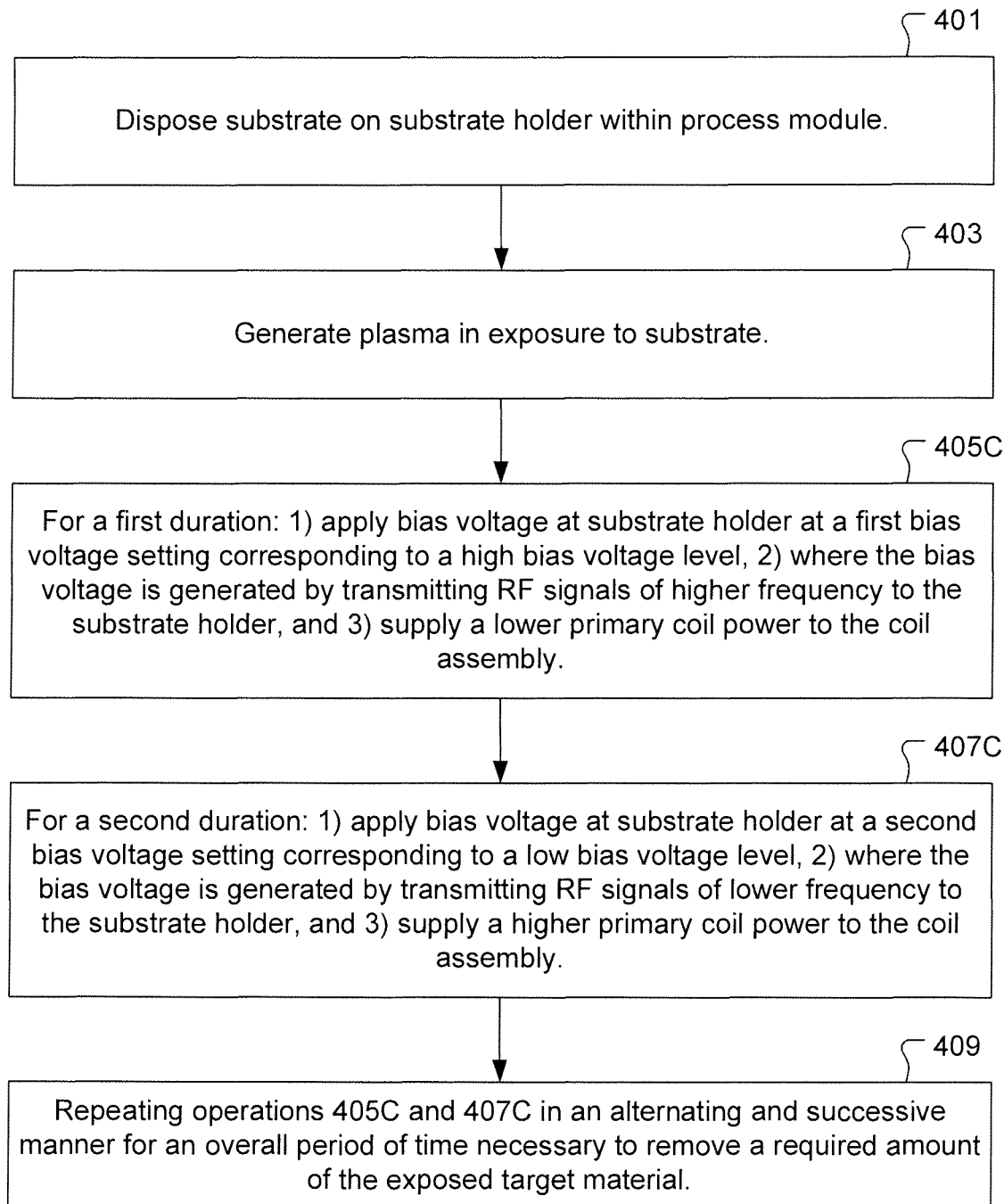
FIG. 7A shows a flowchart of a method for providing advanced ion control to improve etching of target material, in accordance with some embodiments of the present invention.

FIG. 7A shows a flowchart of a method for providing advanced ion control to improve etching of target material, in accordance with some embodiments of the present invention. The method of FIG. 7A is an extension of the method of FIG. 4A. Specifically, the method of FIG. 7A is a combination of the methods of FIGS. 5A and 6A. The method of FIG. 7A includes operations 401, 403, and 409 as previously described with regard to FIG. 4A. However, in place of the operations 405 and 407 of FIG. 4A, the method of FIG. 7A includes modified operations 405C and 407C, respectively. The operation 405C is a combination of the operations 405A from FIGS. 5A and 405B from FIG. 6A. In the operation 405C, for the first duration corresponding to the first process state (A), the bias voltage is applied at the substrate holder 102 at the first bias voltage setting corresponding to the high bias voltage level, where the bias voltage is generated by transmitting RF signals of higher frequency to the substrate holder 102, and a lower primary coil power is supplied to the coil assembly 105. The operation 407C is a combination of the operations 407A from FIGS. 5A and 407B from FIG. 6A. In the operation 407C, for the second duration corresponding to the second process state (B), the bias voltage is applied at the substrate holder 102 at the second bias voltage setting corresponding to the low bias voltage level, where the bias voltage is generated by transmitting RF signals of lower frequency to the substrate holder 102, and a higher primary coil power is supplied to the coil assembly 105.

Figure 7B:
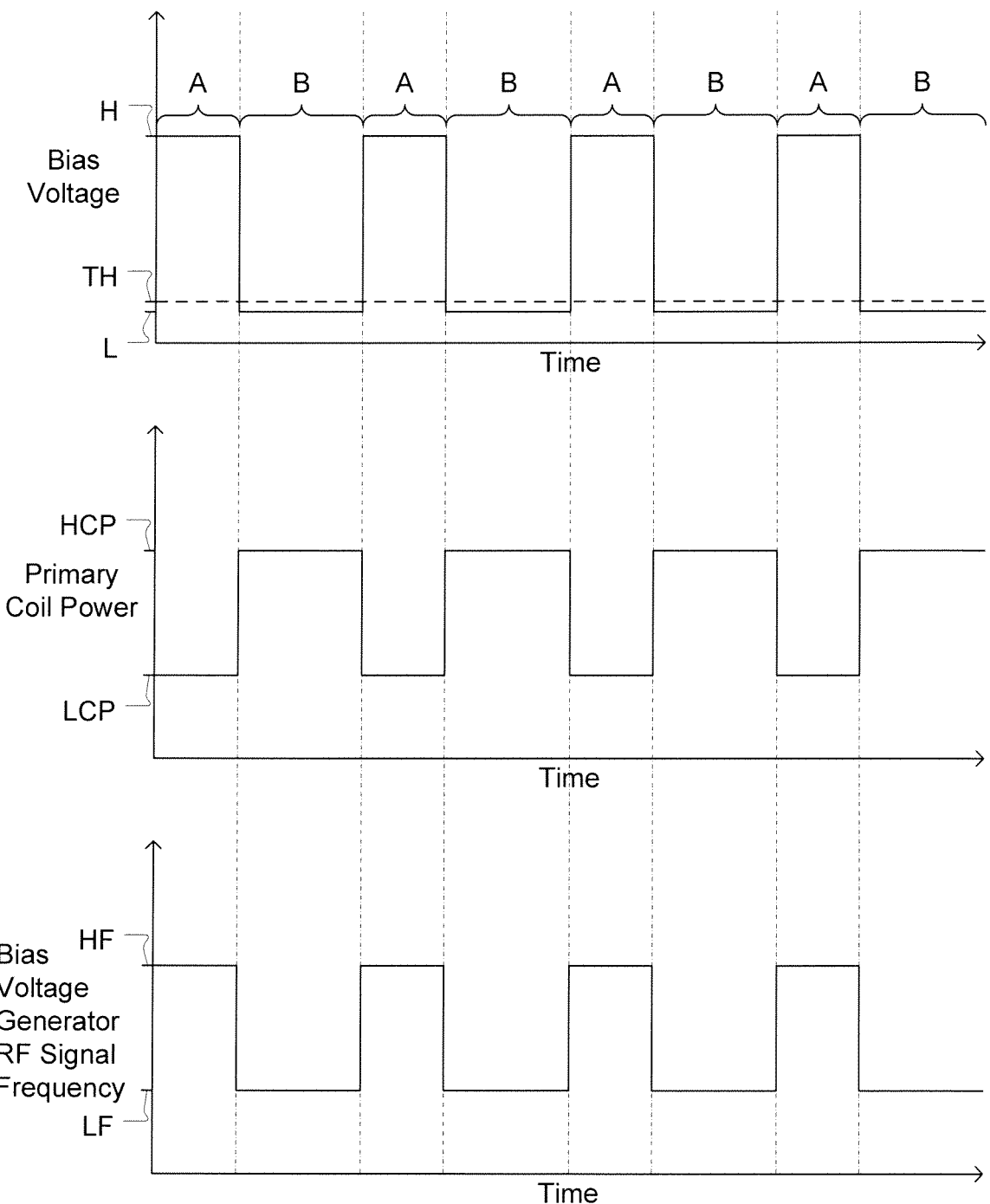
FIG. 7B shows an example plot of bias voltage versus time and corresponding example plot of bias voltage generator RF signal frequency versus time and corresponding example plot of primary coil power versus time corresponding to the method of FIG. 7A, in accordance with some embodiments of the present invention.

FIG. 7B shows an example plot of bias voltage versus time and corresponding example plot of bias voltage generator RF signal frequency versus time and corresponding example plot of primary coil power versus time corresponding to the method of FIG. 7A, in accordance with some embodiments of the present invention. As shown in FIG. 7B, both the primary coil power is changed between process states A and B and the bias voltage generator RF signal frequency is changed between states A and B. In process state A, the bias voltage is high and the primary coil power is low and the frequency of the RF signals used to generate the bias voltage is high. In process state B, the bias voltage is low and the primary coil power is high and the frequency of the RF signals used to generate the bias voltage is low.

Figure 8A:
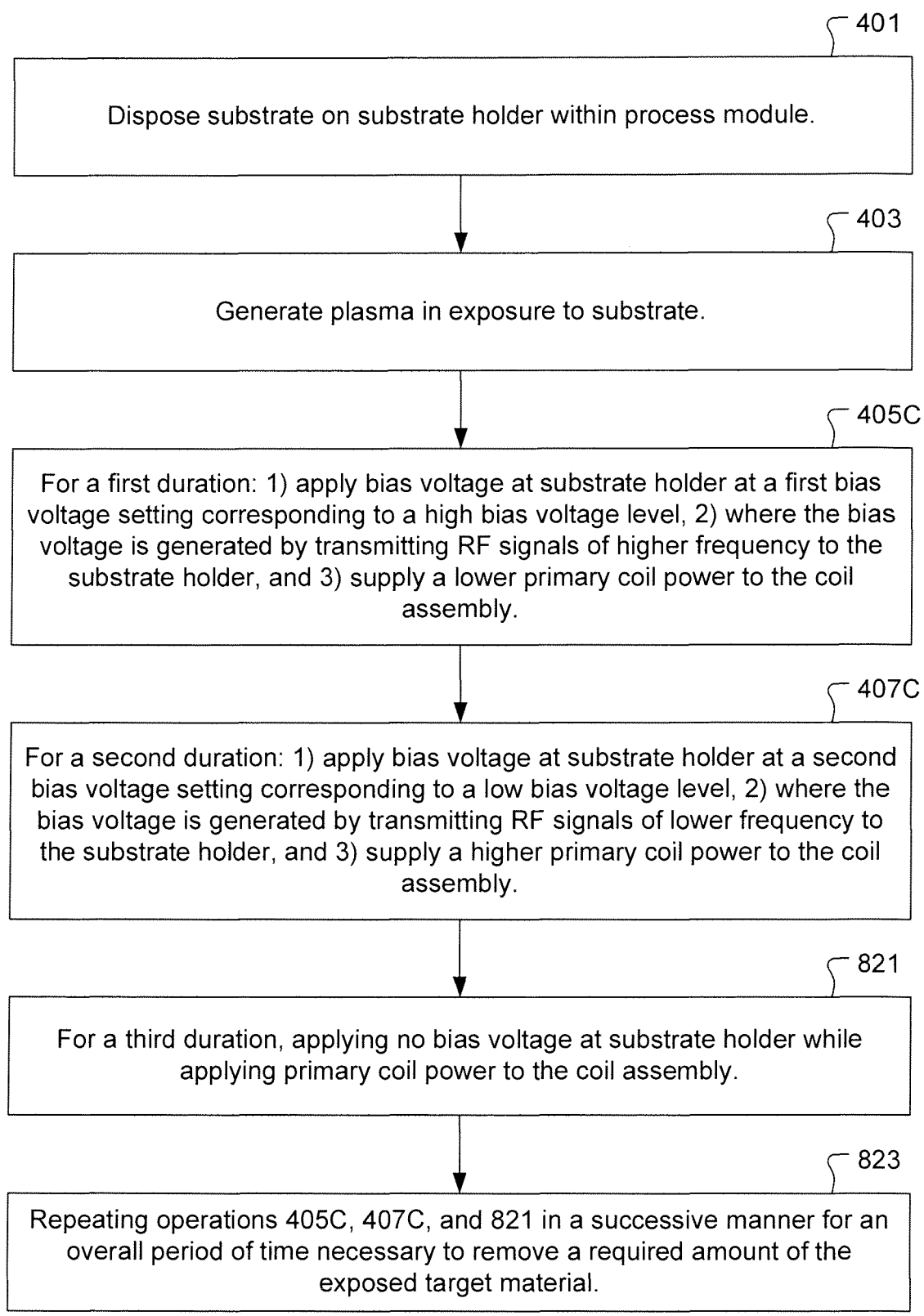
FIG. 8A shows a flowchart of an alternate method for providing advanced ion control to improve etching of target material, in accordance with some embodiments of the present invention.

FIG. 8A shows a flowchart of an alternate method for providing advanced ion control to improve etching of target material, in accordance with some embodiments of the present invention. The method of FIG. 8A is an extension of the method of FIG. 7A. The method of FIG. 8A includes operations 401 and 403, as previously described with regard to FIG. 4A. Also, the method of FIG. 8A includes operations 405C and 407C, as previously described with regard to FIG. 7A. Additionally, the method of FIG. 8A includes an operation 821, in which for a third duration, no bias voltage is applied at the substrate holder. In some embodiments, the higher primary coil power of operation 407C is supplied to the coil assembly 105 during operation 821. In some embodiments, the lower primary coil power of operation 405C is supplied to the coil assembly 105 during operation 821. In some embodiments, the primary coil power supplied to the coil assembly 105 during operation 821 is at a level between the lower primary coil power of operation 405C and the higher primary coil power of operation 407C. From the operation 821, the method proceeds with an operation 823 for repeating operations 405C, 407C, and 821 in a successive manner for an overall period of time necessary to remove a required amount of the exposed target material. In an example embodiment, the method of FIG. 8A is performed such that the operation 405C includes applying a high bias voltage at about 1500 V for a first duration of about 500 microseconds, and the operation 407C includes applying a low bias voltage at about 100 V for a second duration of about 500 microseconds, and the operation 821 includes applying no bias voltage for a duration of about 500 microseconds. It should be understood that in various embodiments, the respective durations of operations 405C, 407C, and 821 in the method of FIG. 8A can be the same or different, depending on what is necessary to achieve a desired processing result on the substrate.

Figure 8B:
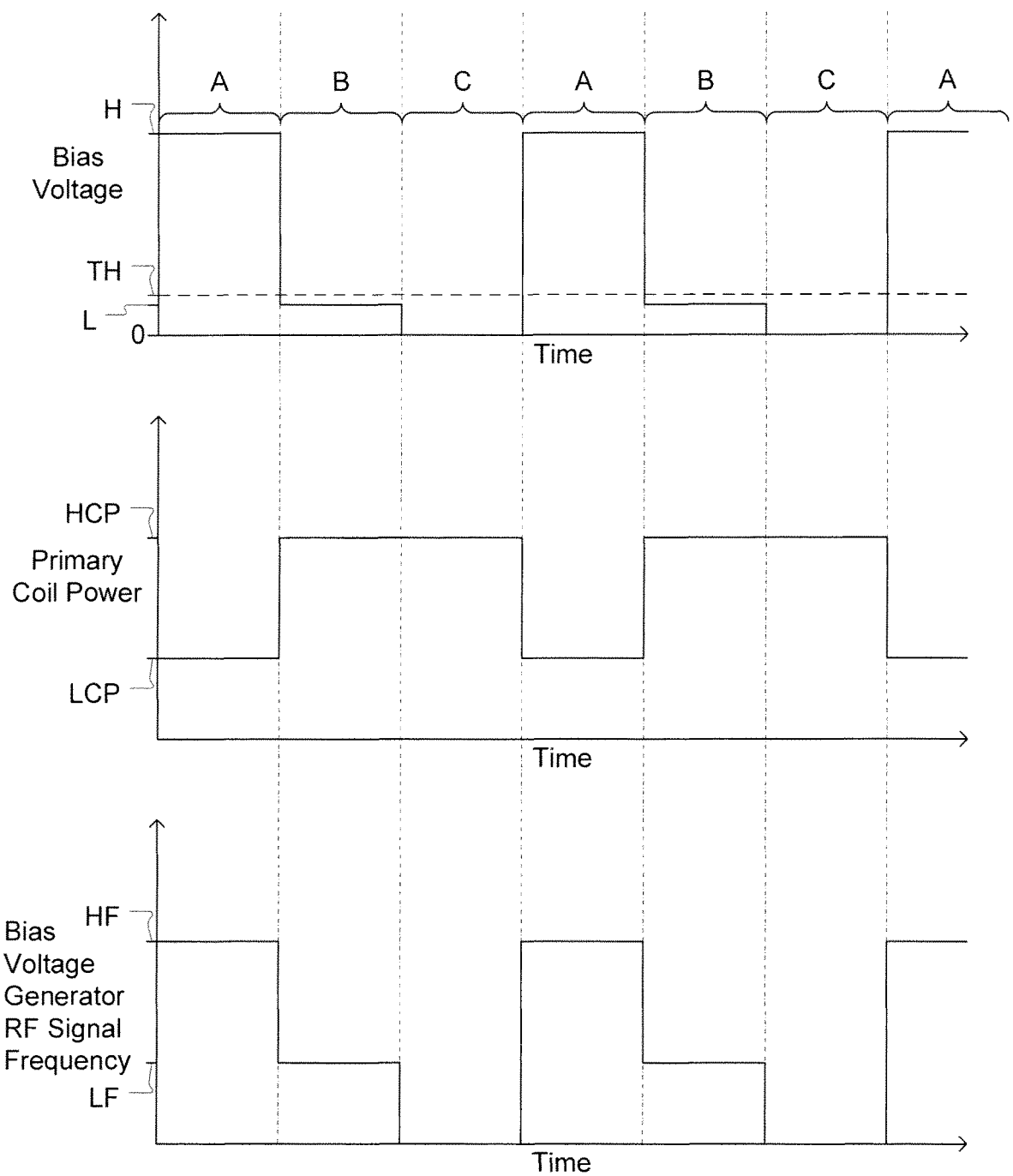
FIG. 8B shows an example plot of bias voltage versus time and corresponding example plot of bias voltage generator RF signal frequency versus time and corresponding example plot of primary coil power versus time corresponding to the method of FIG. 8A, in accordance with some embodiments of the present invention.

FIG. 8B shows an example plot of bias voltage versus time and corresponding example plot of bias voltage generator RF signal frequency versus time and corresponding example plot of primary coil power versus time corresponding to the method of FIG. 8A, in accordance with some embodiments of the present invention. As shown in FIG. 8B, both the primary coil power is changed between process states A and B and the bias voltage generator RF signal frequency is changed between process states A and B. FIG. 8B also shows that no bias voltage is applied in process state C. In process state A, the bias voltage is high and the primary coil power is low and the frequency of the RF signals used to generate the bias voltage is high. In process state B, the bias voltage is low and the primary coil power is high and the frequency of the RF signals used to generate the bias voltage is low. In process state C, the bias voltage is off, i.e., zero, and the primary coil power is kept high. However, in other embodiments, the process state C can have the primary coil power set at any level necessary to achieve a desired processing result on the substrate.

The method of FIG. 8A can be done as a modified HVBP process in which the multiple bias voltage levels, e.g., high, low, and zero, are generated in short pulses. By providing the zero bias voltage process state (C) in operation 821, an additional "pure" radical flux is provided at the top of the mask material and at the bottom of the etched feature, i.e., at the etch front. The "pure" radical flux on the top of the mask material can enhance polymer deposition to provide further protection of the mask material. The amount of "pure" radical flux that reaches the bottom of the etched feature is by diffusion, such that a bigger sized etch feature will have more radical flux reach the bottom etch front, while a smaller sized etch feature will have less radical flux reach the bottom etch front. Considering deposition effects caused by radical flux reaching the etch front, in some embodiments, the provision of "pure" radical flux due to zero bias voltage in operation 821 can serve to offset ARDE results caused by ion-assisted etching, in which bigger sized etch features have a faster etch rate relative to smaller sized etch features. The no bias process state (C) of operation 821 can be used to improve intra-cell loading or iso-dense loading of etch rate, etch profile, and CD difference, caused by small differences in feature size of different cells, or caused by big differences in feature size between isolated and dense features.

Figure 9:
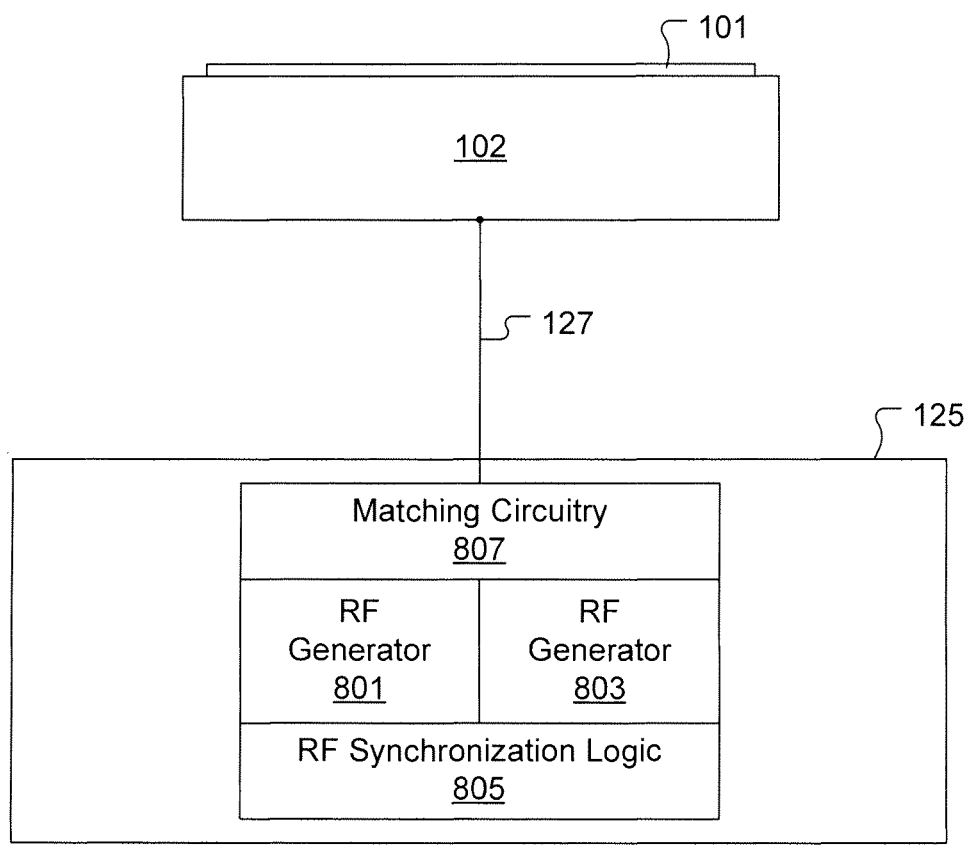
FIG. 9 shows an example of the RF power supply in which a first RF generator and a second RF generator are used to supply RF signals to the substrate holder for generating the bias voltage at the substrate, in accordance with some embodiments of the present invention.

In some embodiments, the methods of FIGS. 4A, 5A, 6A, 7A, and 8A can be implemented using multiple RF generators within the RF power supply 125. FIG. 9 shows an example of the RF power supply 125 in which a first RF generator 801 and a second RF generator 803 are used to supply RF signals to the substrate holder 102 for generating the bias voltage at the substrate 101, in accordance with some embodiments of the present invention. Matching circuitry 807 is configured to control impedance matching so that the RF signals generated by the RF power supply 125 can be transmitted effectively to the plasma loads within the chambers 103. Generally speaking, the matching circuitry 807 is a network of capacitors and inductors that can be adjusted to tune impedance encountered by the RF signals in their transmission to the plasma loads within the chamber 103. In some embodiments, the first RF generator 801 is configured as a pulsing generator, and the second RF generator 803 is configured as a pulsing generator. In some embodiments, the first RF generator 801 is configured to output RF signals of a first frequency, and the second RF generator 803 is configured to output RF signals of a second frequency, where the first and second frequencies are different.

The RF power supply 125 includes RF synchronization logic 805 configured to synchronize operation of the first RF generator 801 and the second RF generator 803, to enable generation of the bias voltage as required for each of the alternating process states (A) and (B), as discussed above. In some embodiments, the RF synchronization logic 805 is configured to enable communication between the first RF generator 801 and the second RF generator 803, vice-versa. In some embodiments, by way of the RF synchronization logic 805, one of the first and second RF generators 801/803 is configured to operate as a master RF generator, with the other of the first and second RF generators 801/803 configured to operate as a slave RF generator. In these embodiments, the master RF generator operates to direct the slave RF generator when to output RF signals to the substrate holder 102. In various embodiments, the RF synchronization logic 805 is configured as a combination of hardware and software. In some embodiments, the RF synchronization logic 805 can be implemented in each of the first and second RF generators 801/803. In a particular embodiment, the RF synchronization logic 805 is defined to direct one of the first and second RF generators 801/803 to operate in a continuous wave mode, in which it generates RF signals and supplies those RF signal to the substrate holder 102 in a continuous manner. Also, in this particular embodiment, the RF synchronization logic 805 is defined to direct the other of the first and second RF generators 801/803 to operate in a pulsed manner, in which RF signals are generated during a high phase of a pulse for transmission in an additive manner in conjunction with the RF signals being supplied the other RF generator 801/803 operating in the continuous wave mode.

As semiconductor device technology continues to develop, it is necessary to etch more layers of alternating materials, such as alternating $SiO_2$/SiN, or $SiO_2$/Si, among others, in order to form three-dimensional structures, particularly in NAND memory devices. Because of this, thicker and/or harder mask material is required, such as harder carbon mask for ON or OP etch. And, HAR etching of carbon (hole or slit features) is a challenge due requirements for selectivity (greater than 50-to-1 for target material-to-mask material, e.g., carbon-to-$SiO_2$/SiN/SiON/Si-ARC), etch rate (depending on material and application, possibly greater than 300 nanometers/minute), and profile control and hole distortion control (defined as minor axis/major axis of an ellipse, with a target control of greater than 0.95 of ideal). Also, in performing the above-mentioned HAR plasma etching processes, an $O_2$ plasma with some passivation gas, such as COS, $SO_2$, $N_2$, $CH_4$, among others, is an effective choice, with ion-assisted etch being the primary etch mechanism. It should be understood, that the methods for providing advanced ion control to improve etching of target material as discussed herein with regard to the methods of FIGS. 4A, 5A, 6A, 7A, and 8A can be used to perform difficult HAR etching processes, such as that mentioned above. The methods disclosed herein provide for faster target material etch rate, higher etching selectivity of target material relative to mask material, better profile control, and less hole distortion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the described embodiments.

What is claimed is:

1. A system for controlling ions during a plasma processing operation performed on a substrate, comprising:
　　radiofrequency (RF) synchronization logic configured to control a first bias RF generator, a second bias RF generator, and a coil RF power supply to operate in accordance with a first process state and a second process state and a third process state such that the first, second, and third process states occur in a successive manner and such that a sequence of the first, second, and third process states repeat for an overall period of time,
　　the first process state having the first and second bias RF generators operate to apply a high bias voltage level and the coil RF power supply operate to supply a low power,
　　the second process state having the first and second bias RF generators operate to apply a low bias voltage level and the coil RF power supply operate to supply a high power, the low bias voltage level being greater than zero,
　　the third process state having the first and second bias RF generators operate to apply zero bias voltage.

2. The system as recited in claim 1, wherein the third process state has the coil RF power supply operate to supply either the low power as supplied in the first process state, or the high power as supplied in the second process state, or a power between the low power as supplied in the first process state and the high power as supplied in the second process state.

3. The system as recited in claim 1, wherein the high bias voltage level is within a range extending from about 400 V to about 3000 V, and
　　wherein the low bias voltage level is within a range extending from about 20 V to about 300 V.

4. The system as recited in claim 1, wherein the RF synchronization logic is configured to control the coil RF power supply to supply the low power within a range extending from about 50 Watts (W) to about 2000 W during the first process state, and
　　wherein the RF synchronization logic is configured to control the coil RF power supply to supply the high power within a range extending from about 2000 W to about 5000 W during the second process state.

5. The system as recited in claim 1, wherein the RF synchronization logic is configured to control one or both of the first and second bias RF generators to transmit RF signals of higher frequency during the first process state, and wherein the RF synchronization logic is configured to control one or both of the first and second bias RF generators to transmit RF signals of lower frequency during the second process state.

6. The system as recited in claim 5, wherein the RF signals of higher frequency have a frequency within a range extending from about 13 megaHertz (MHz) to about 60 MHz, and wherein the RF signals of lower frequency have a frequency within a range extending from about 400 kiloHertz (kHz) to about 2 MHz.

7. The system as recited in claim 1, wherein the low bias voltage level is less than a threshold bias voltage required for ion-induced removal of a mask material from a substrate.

8. The system as recited in claim 1, wherein the first and second bias RF generators apply bias voltage at a substrate holder.

9. The system as recited in claim 8, wherein a plasma is generated over the substrate holder.

10. The system as recited in claim 1, wherein the RF synchronization logic is configured to control a duration of the first process state to be at least 1 second and a duration of the second process state to be at least 1 second.

11. The system as recited in claim 1, wherein the RF synchronization logic is configured to control a duration of the first process state to be less than 100 milliseconds and a duration of the second process state to be less than 100 milliseconds.

12. The system as recited in claim 1, wherein the RF synchronization logic is configured to control a duration of the first process state to be different than a duration of the second process state.

13. The system as recited in claim 12, wherein the RF synchronization logic is configured to control a duration of the third process state to be substantially equal to the duration of the first process state or the duration of the second process state.

14. The system as recited in claim 12, wherein the RF synchronization logic is configured to control a duration of the third process state to be different than each of the duration of the first process state and the duration of the second process state.

15. The system as recited in claim 1, wherein the RF synchronization logic is configured to control a duration of the first process state to be substantially equal to a duration of the second process state.

16. The system as recited in claim 15, wherein the RF synchronization logic is configured to control a duration of the third process state to be substantially equal to the duration of the second process state.

17. The system as recited in claim 1, wherein the RF synchronization logic is configured to control a duration of the first process state to be less than ten percent of a sum of the durations of the first and second process states.

18. The system as recited in claim 1, wherein the RF synchronization logic is configured to control a duration of the third process state to saturate an etch front on a substrate with a radical flux during the third process state.

19. The system as recited in claim 1, wherein the RF synchronization logic is configured to operate both the first and second bias RF generators in the first process state, and wherein the RF synchronization logic is configured to operate the second bias RF generator but not the first bias RF generator in the second process state.

20. The system as recited in claim 19, wherein the second bias RF generator is configured to generate continuous wave RF signals.

* * * * *